United States Patent
Pasquale et al.

(10) Patent No.: US 9,508,547 B1
(45) Date of Patent: Nov. 29, 2016

(54) COMPOSITION-MATCHED CURTAIN GAS MIXTURES FOR EDGE UNIFORMITY MODULATION IN LARGE-VOLUME ALD REACTORS

(71) Applicant: Lam Research Corporation, Fremont, CA (US)

(72) Inventors: Frank L. Pasquale, Beaverton, OR (US); Chloe Baldasseroni, Portland, OR (US); Edward Augustyniak, Tualatin, OR (US); Yukinori Sakiyama, West Linn, OR (US); Shankar Swaminathan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/828,291

(22) Filed: Aug. 17, 2015

(51) Int. Cl.
*H01L 21/31* (2006.01)
*H01L 21/02* (2006.01)

(52) U.S. Cl.
CPC ... *H01L 21/02274* (2013.01); *H01L 21/02126* (2013.01); *H01L 21/02164* (2013.01)

(58) Field of Classification Search
CPC ...... H01J 37/32; C23C 16/455; C23C 16/50; C23C 16/458; C23C 16/46
USPC ....... 438/16, 778; 427/532, 569; 156/345.32
See application file for complete search history.

(56) References Cited

U.S. PATENT DOCUMENTS

| | | | | |
|---|---|---|---|---|
| 4,673,447 A | * | 6/1987 | Sakai | B65G 51/03 134/156 |
| 5,871,811 A | * | 2/1999 | Wang | C23C 16/402 257/E21.274 |
| 5,892,235 A | * | 4/1999 | Yamazaki | H01J 37/3171 250/398 |
| 6,002,109 A | * | 12/1999 | Johnsgard | C23C 16/4411 118/50.1 |
| 6,143,081 A | * | 11/2000 | Shinriki | C23C 16/405 118/715 |
| 6,192,858 B1 | * | 2/2001 | Nieberding | F02B 75/02 123/323 |
| 6,217,715 B1 | * | 4/2001 | Sun | C23C 14/3407 204/192.12 |
| 6,403,925 B1 | * | 6/2002 | Johnsgard | C23C 16/4411 118/728 |
| 8,409,351 B2 | * | 4/2013 | Robbins | C23C 16/325 117/103 |
| 8,637,411 B2 | | 1/2014 | Swaminathan et al. | |
| 8,728,956 B2 | | 5/2014 | LaVoie et al. | |

(Continued)

OTHER PUBLICATIONS

US Office Action dated Dec. 15, 2015 issued in U.S. Appl. No. 14/447,203.

(Continued)

*Primary Examiner* — Caleb Henry
(74) *Attorney, Agent, or Firm* — Weaver Austin Villeneuve & Sampson LLP

(57) ABSTRACT

Disclosed are methods of performing film deposition. The methods may include volumetrically isolating a first process station from a second process station by flowing a curtain gas between them, and igniting first and second plasmas supported by first and second plasma feed gases, while flowing the curtain gas, to cause film deposition at the first and second process stations. The curtain gas and the first and second plasma feed gases may each include a high-breakdown voltage species that may be molecular oxygen. The high-breakdown voltage species may have a breakdown voltage of at least about 250 V for a pressure-distance (pd) value of 3.4 Torr-cm. The curtain gas may have a higher concentration of the high-breakdown voltage species than the first and second plasma feed gases. The high-breakdown voltage species may make up about 5-50% of the curtain gas by mole fraction. The high-breakdown voltage species may be molecular oxygen.

20 Claims, 9 Drawing Sheets

(56) References Cited

U.S. PATENT DOCUMENTS

| | | | |
|---|---|---|---|
| 8,871,654 B2* | 10/2014 | Kato | H01L 21/02233 438/771 |
| 8,956,983 B2 | 2/2015 | Swaminathan et al. | |
| 8,999,859 B2 | 4/2015 | Swaminathan et al. | |
| 2002/0104556 A1* | 8/2002 | Puri | B08B 3/102 134/36 |
| 2003/0192476 A1* | 10/2003 | Fork | C23C 14/14 118/719 |
| 2008/0173401 A1* | 7/2008 | Jeon | H01J 37/32532 156/345.33 |
| 2008/0280068 A1* | 11/2008 | Ahn | B01J 4/002 427/580 |
| 2009/0038541 A1* | 2/2009 | Robbins | C23C 16/325 117/104 |
| 2009/0109595 A1* | 4/2009 | Herchen | H01L 21/6831 361/234 |
| 2009/0233434 A1 | 9/2009 | Kim et al. | |
| 2009/0270849 A1* | 10/2009 | Truckai | A61B 18/042 606/13 |
| 2010/0078578 A1* | 4/2010 | Schuermann | G03F 7/70033 250/504 R |
| 2012/0009802 A1 | 1/2012 | LaVoie et al. | |
| 2012/0043198 A1* | 2/2012 | Yamazaki | C23C 14/086 204/192.1 |
| 2013/0344245 A1 | 12/2013 | Xia et al. | |
| 2014/0044889 A1* | 2/2014 | Qi | C23C 16/45536 427/595 |
| 2014/0072726 A1 | 3/2014 | Kim | |
| 2014/0209562 A1 | 7/2014 | LaVoie et al. | |
| 2014/0217193 A1 | 8/2014 | Breiling et al. | |
| 2015/0017812 A1* | 1/2015 | Chandrasekharan | H01L 21/0228 438/762 |
| 2015/0048739 A1* | 2/2015 | Forster | H01J 37/32357 315/111.21 |
| 2015/0147889 A1* | 5/2015 | Yudovsky | H01L 21/0228 438/758 |
| 2015/0155157 A1* | 6/2015 | Song | H01L 21/022 257/637 |
| 2015/0194298 A1* | 7/2015 | Lei | H01L 21/0217 438/680 |
| 2015/0200110 A1* | 7/2015 | Li | H01L 21/31144 438/696 |
| 2015/0243490 A1* | 8/2015 | Ryu | H01J 37/32899 216/67 |
| 2015/0262792 A1* | 9/2015 | Bera | H01J 37/32128 315/111.21 |
| 2015/0275364 A1* | 10/2015 | Thompson | C23C 16/45544 427/532 |
| 2015/0299855 A1* | 10/2015 | Yudovsky | C23C 16/52 427/8 |
| 2015/0299909 A1* | 10/2015 | Mizuno | D01F 9/32 432/8 |
| 2015/0368798 A1* | 12/2015 | Kwong | C23C 16/45544 118/729 |
| 2015/0380221 A1* | 12/2015 | Liu | C23C 16/45536 427/569 |
| 2016/0035566 A1 | 2/2016 | LaVoie et al. | |
| 2016/0068953 A1* | 3/2016 | Li | C23C 16/4412 118/712 |
| 2016/0097122 A1* | 4/2016 | Yudovsky | C23C 16/45544 118/725 |
| 2016/0138160 A1* | 5/2016 | Lambert | C23C 16/48 427/553 |

OTHER PUBLICATIONS

US Notice of Allowance dated Jul. 29, 2016 issued in U.S. Appl. No. 14/447,203.

* cited by examiner

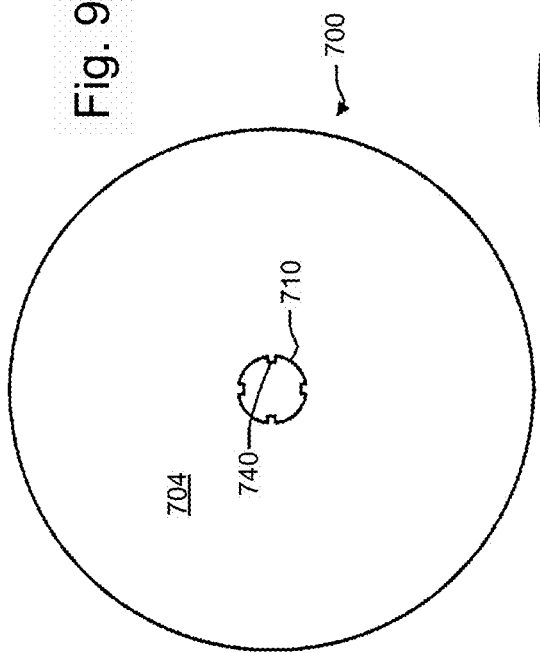
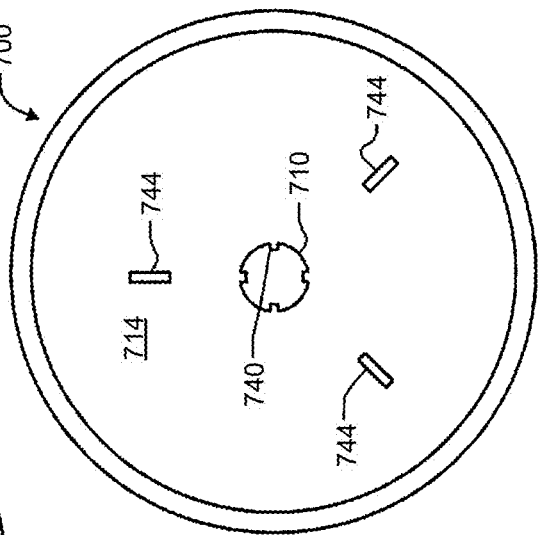
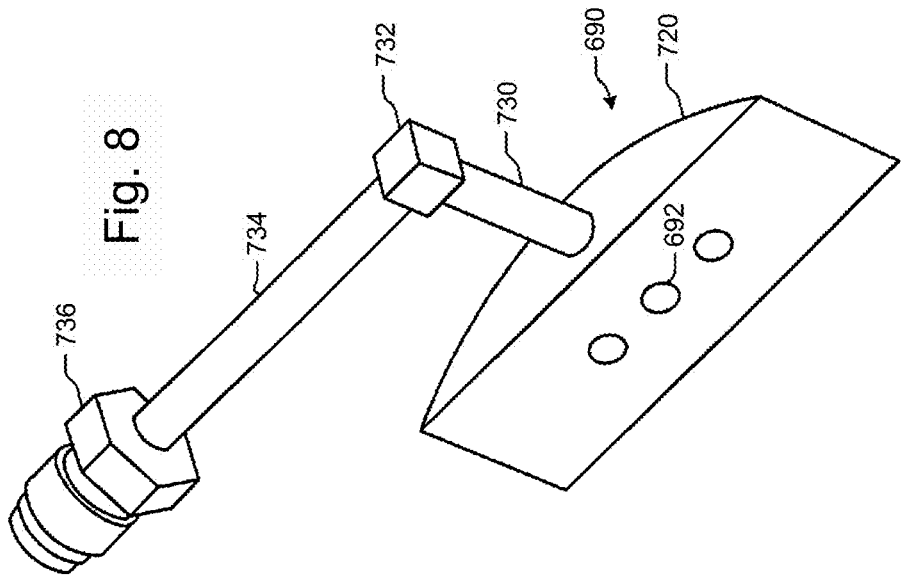

COMPOSITION-MATCHED CURTAIN GAS MIXTURES FOR EDGE UNIFORMITY MODULATION IN LARGE-VOLUME ALD REACTORS

BACKGROUND

As integrated circuit (IC) device and substrate feature sizes continue to shrink in the semiconductor industry, as well as the increased use of 3D devices structures in IC designs (e.g., Intel's Tri-Gate transistor architecture), the capability of depositing thin conformal films (films of material having a uniform thickness relative to the shape of the underlying structure, even if non-planar) will continue to gain importance. Atomic layer deposition (ALD) is a film forming technique which is well-suited to the deposition of conformal films due to the fact that a single cycle of ALD only deposits a single thin layer of material—a result of the ALD process involving the formation of an adsorption-limited layer of one or more film precursor reactants prior to the film-forming surface reaction of the precursors. Multiple "ALD cycles" may then be used to build up a film of the desired thickness, and since each layer is thin and conformal, the resulting film substantially conforms to the shape of the underlying substrate features and/or device structures.

However, there are many challenges associated with employing ALD processes in semiconductor fabrication, oftentimes relating to the fact that many ALD cycles are required to build up a film of appreciable thickness. Rapid ALD cycle times may be facilitated by specialized semiconducting processing hardware, however, without careful design of these deposition apparatuses and the film forming operations performed in them, the uniformity of the resulting ALD films may be compromised. Accordingly, methods and apparatuses are sought which improve the uniformity of films deposited via ALD and related processes.

SUMMARY

Disclosed are methods of performing plasma-activated film deposition in a multi-station semiconductor substrate processing chamber. The methods may include volumetrically isolating a first process station from a second process station by flowing a curtain gas between them, igniting a first plasma supported by a first plasma feed gas, while flowing the curtain gas, to cause film deposition at the first process station, and igniting a second plasma supported by a second plasma feed gas, while flowing the curtain gas, to cause film deposition at the second process station. The curtain gas and the first and second plasma feed gases may each include a high-breakdown voltage species. The high-breakdown voltage species may have a breakdown voltage of at least about 250 V for a pressure-distance (pd) value of 3.4 Torr-cm. The curtain gas may have a higher concentration of the high-breakdown voltage species than the plasma feed gases. The first and second plasma feed gases may have substantially the same chemical composition. The high-breakdown voltage species may make up about 5-50% of the curtain gas by mole fraction. The high-breakdown voltage species may be molecular oxygen.

Also disclosed are apparatuses for performing plasma-activated film deposition. The apparatuses may include a processing chamber, a first process station within the processing chamber, a second process station within the processing chamber, a first chandelier showerhead, a first showerhead collar which surrounds the stem portion of the first chandelier showerhead, a second chandelier showerhead, a second showerhead collar which surrounds the stem portion of the second chandelier showerhead, and a controller.

The first and second chandelier showerheads may each include a head portion having apertures in their bottom surface for flowing a plasma feed gas into the processing chamber, and may also include stem portions. The first and second showerhead collars may have apertures for flowing a curtain gas into the processing chamber. The curtain gas may be flowed into the processing chamber substantially parallel to the plane of the substrate.

The film deposition apparatuses may also include one or more plasma feed gas flow valves, one or more curtain gas flow valves, one or more film precursor flow valves, a valve-operated vacuum source for removing plasma feed gas, curtain gas, and film precursor from the processing chamber, and a plasma generator for generating a first plasma at the first process station in the processing chamber and for generating a second plasma at the second process station in the processing chamber.

The aforementioned controller of the film deposition apparatuses may include machine-readable instructions for: operating the curtain gas flow valves to flow the curtain gas between the first and second process stations so as to volumetrically isolate the first process station from the second process station; operating the plasma feed gas flow valves to flow the first plasma feed gas in the vicinity of the first process station; operating the plasma feed gas flow valves to flow the second plasma feed gas in the vicinity of the second process station; operating the film precursor flow valves to flow a first film precursor in the vicinity of the first process station; operating the film precursor flow values to flow a second film precursor in the vicinity of the second process station; operating the plasma generator to ignite a first plasma supported by the first plasma feed gas, while the curtain gas is flowing, to cause the reaction of the first film precursor and deposition at the first process station; and operating the plasma generator to ignite a second plasma supported by the second plasma feed gas, while the curtain gas is flowing, to cause the reaction of the second film precursor and deposition at the second process station.

BRIEF DESCRIPTION OF THE DRAWINGS

FIG. 8 is a perspective view of an example fluid connector for the showerhead collar of FIG. 7.

FIGS. 9A and 9B are top and bottom plan views of example plates of the showerhead of FIG. 6.

DETAILED DESCRIPTION

In the following description, numerous specific details are set forth in order to provide a thorough understanding of the present invention. However, the present invention may be practiced without some or all of these specific details. In other instances, well known process operations have not been described in detail so as to not unnecessarily obscure the present invention. While the invention will be described in conjunction with specific detailed embodiments, it is to be understood that these specific detailed embodiments are not intended to limit the scope of the inventive concepts disclosed herein.

Disclosed herein are methods and apparatuses for performing plasma-activated film deposition in a multi-station semiconductor substrate processing chamber. In some embodiments, the plasma-activated film deposition process may constitute a cyclic ALD process performed multiple times in order to deposit films of material having the desired thickness. As mentioned above, each "ALD cycle," deposits only a thin layer of material (oftentimes only one molecular layer thick).

As described in further detail below, a basic ALD cycle for depositing a single layer of material on a substrate in a processing chamber may include: (i) adsorbing a film precursor on a substrate such that it forms an adsorption-limited layer, (ii) removing (at least some, when present) unadsorbed (including desorbed) film precursor from the vicinity of the process station holding the substrate, and (iii) after removing unadsorbed film precursor, reacting the adsorbed film precursor—e.g, by igniting a plasma in the vicinity of said process station—to form a layer of film on the substrate. ("Unadsorbed" film precursor, as used herein, is defined to include desorbed film precursor.) Oftentimes, an ALD cycle additionally involves an operation (iv) of, after the reaction of adsorbed film precursor, removing desorbed film precursor and/or film precursor reaction by-product from the vicinity of said process station holding the substrate having been deposited upon. The removing in operations (ii) and (iv) may be done via purging the vicinity of the substrate, evacuating by pumping down to a base pressure ("pump-to-base"), etc.

The plasma used to activate the surface reaction in operation (iii) is typically supported by a plasma feed gas which, for example, may be flowed into the reaction chamber through one or more showerheads (described in greater detail below). In some embodiments, the plasma feed gas may be used to purge the chamber in order to effectuate the removal in operations (ii) and (iv).

Overview of Film Deposition Apparatuses

Figure 1:
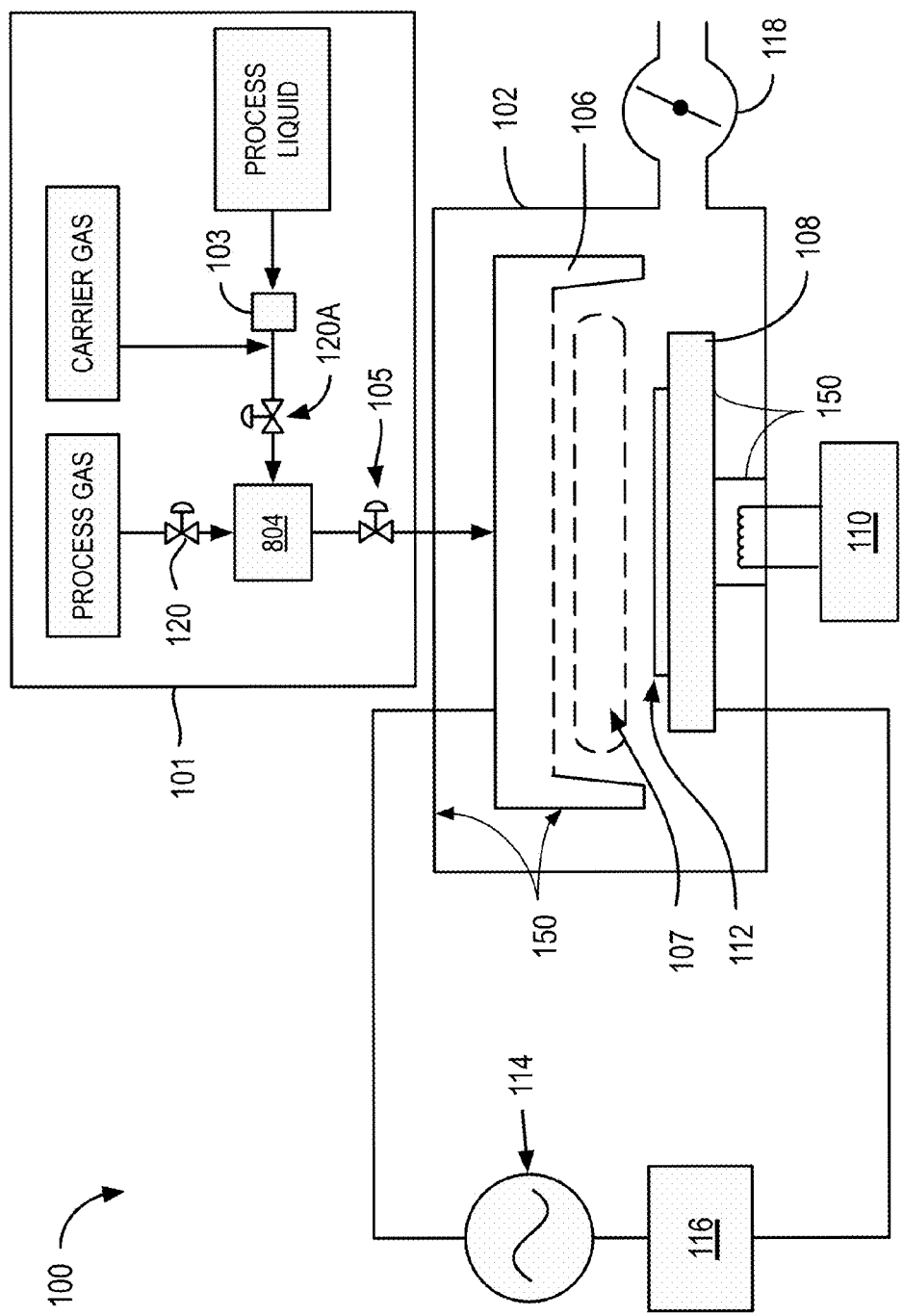
FIG. 1 is a cross-sectional schematic of a substrate processing apparatus having a processing chamber with a single process station.

Operations for depositing films on semiconductor substrates may generally be performed in a substrate processing apparatus like that shown in FIG. 1. The apparatus 100 of FIG. 1, which will be described in greater detail below, has a single processing chamber 102 with a single substrate holder 108 in an interior volume which may be maintained under vacuum by vacuum pump 118. Also fluidically coupled to the chamber for the delivery of (for example) film precursors, carrier and/or purge and/or process gases, secondary reactants, etc. is gas delivery system 101 and showerhead 106. Equipment for generating a plasma within the processing chamber is also shown in FIG. 1 and will be descried in further detail below. In any event, as it is described in detail below, the apparatus schematically illustrated in FIG. 1 provides the basic equipment for performing film deposition operations such as ALD on semiconductor substrates.

While in some circumstances a substrate processing apparatus like that of FIG. 1 may be sufficient, when time-consuming film deposition operations are involved, it may be advantageous to increase substrate processing throughput by performing multiple deposition operations in parallel on multiple semiconductor substrates simultaneously. For this purpose, a multi-station substrate processing apparatus may be employed like that schematically illustrated in FIG. 2. The substrate processing apparatus 200 of FIG. 2, still employs a single substrate processing chamber 214, however, within the single interior volume defined by the walls of the processing chamber, are multiple substrate process stations, each of which may be used to perform processing operations on a substrate held in a wafer holder at that process station. In this particular embodiment, the multi-station substrate processing apparatus 200 is shown having 4 process stations 201, 202, 203, and 204. The apparatus also employs a substrate loading device, in this case substrate handler robot 226, for loading substrates at process stations 201 and 202, and a substrate transferring device, in this case substrate carousel 290, for transferring substrates between the various process stations 201, 202, 203, and 204. Other similar multi-station processing apparatuses may have more or fewer processing stations depending on the embodiment and, for instance, the desired level of parallel wafer processing, size/space constraints, cost constraints, etc. Also shown in FIG. 2, which will be described in greater detail below, is a controller 250 which also assists the goal of performing efficient substrate deposition operations such as in, for example, atomic layer deposition (ALD) operations.

Figure 2:
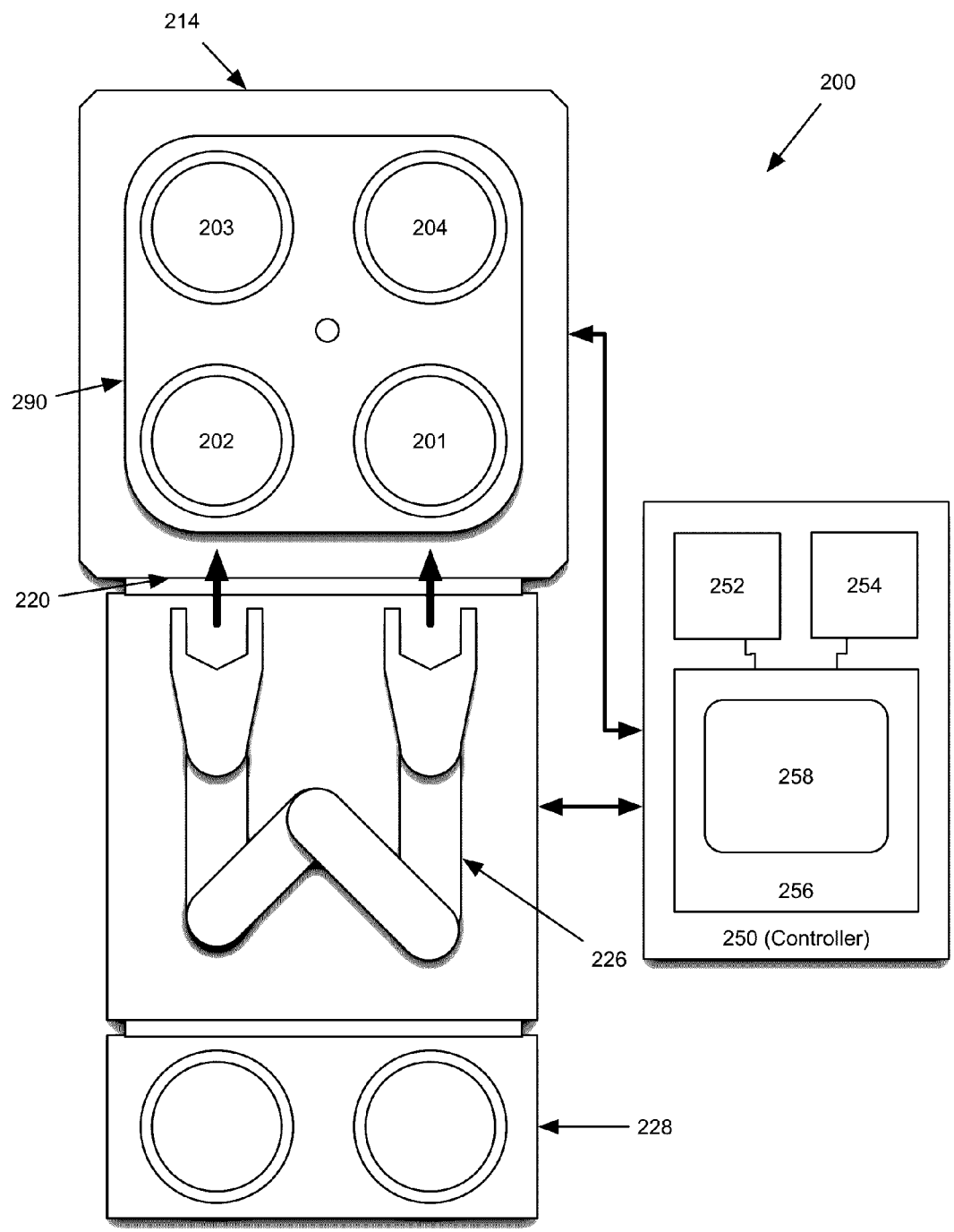
FIG. 2 is a schematic of a 4-station substrate processing apparatus having a substrate handler robot for loading and unloading substrates from 2 process stations and a controller for operating the apparatus.

Note that various efficiencies may be achieved through the use of a multi-station processing apparatus like that shown in FIG. 2 with respect to both equipment cost and operational expenses. For instance, a single vacuum pump (not shown in FIG. 2, but e.g. 118 in FIG. 1) may be used to create a single high-vacuum environment for all 4 process stations and it may also be used to evacuate spent process gases, etc. with respect to all 4 process stations. Depending on the embodiment, each process station typically has its own dedicated showerhead for gas delivery (see, e.g., 106 in FIG. 1), but share the same gas delivery system (e.g., 101 in FIG. 1). Likewise, certain elements of the plasma generator equipment may be shared amongst process stations (e.g., power supplies), although depending on the embodiment, certain aspects may be process station-specific (for example, if showerheads are used to apply plasma-generating electrical potentials—see the discussion of FIG. 1 below). Once again, however, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

Another advantage associated with substrate processing chambers having multiple process station is the use of higher-power plasmas than are generally feasible in single process station chambers. This is due to the fact that a multi-station chamber is generally volumetrically larger than a single station chamber, and the larger chamber volumes allow for the use of larger voltages for plasma generation without causing electrical arcing to the chamber walls; meaning that larger plasma powers can be safely used, often leading to a correspondingly higher-density deposited dielectric film, and with a potentially wider scope of application.

Implementation and Application of a Curtain Gas for Volumetrically Isolating Process Stations and Reducing Spurious Chamber Wall Film Deposition While using larger processing chambers with multiple process stations may provide the aforementioned benefits, there are certain advantages generally associated with employing a smaller single-station processing chamber. One of these is rapid cycling of the chamber volume—being capable of rapidly introducing and removing reactants, by-products, etc. This may be particular important in ALD processes where many deposition cycles are required in order to deposit a film of appreciable thickness, and thus time-spent cycling chamber volumes may be quite significant.

Accordingly, it is desirable to combine the high plasma powers (and other benefits) associated with larger-volume multi-process station chambers with the rapid volume-cycling times associated with smaller single-process station chambers. One way of doing this is to "simulate" smaller chamber volumes within a large multi-process chamber by flowing curtains of gas between the various process stations and thereby volumetrically isolating the different process stations during film deposition operations.

For instance, during a sequence of ALD cycles, such a "curtain gas" may be flowed between the process stations to prevent intermixing of reactants, plasma feed gases, etc. while not interfering with (at least not to an unworkable extent) the reactive film-deposition processes occurring at each process station. While this may "simulate" a smaller volume for the purposes of reactant flow and by-product purge, the advantages of a larger chamber volume remain intact with respect to high-plasma power and scaling of certain component costs. Moreover, in addition to the foregoing benefits, volumetric isolation of process stations via curtain gas flow may allow the sequence of operations making up an ALD cycle to be staggered between process stations. Various benefits associated with such staggered ALD cycling are described in detail in U.S. patent application Ser. No. 14/133,246, filed Dec. 18, 2013, now U.S. Pat. No. 8,940,646, titled "SEQUENTIAL PRECURSOR DOSING IN AN ALD MULTI-STATION/BATCH REACTOR," hereby incorporated by reference in its entirety for all purposes.

It is noted, however, that in order for the foregoing benefits to be achieved, it is not necessarily the case that the various process stations are perfectly volumetrically isolated from one another by the curtain gas flow. In general, one would expect this not to be the case. Thus, in the context of this disclosure, "volumetrically isolating" one process station from another via curtain gas flow is to be interpreted to mean that the curtain gas flow between process stations works to significantly reduce the mixing of gases between process stations that what would occur if no such curtain gas were employed. This is to be contrasted with the "complete" or "perfect" volumetric isolation that would exist if each process station resided in its own separate process chamber; volumetrically isolating with a curtain gas does not imply or require such perfect/complete separation/isolation.

In plasma-based ALD operations, the curtain gas may be viewed as distinct from the plasma feed gas, the latter being used to support the plasma which is ignited in ALD operation (iii) (see above) to activate the reaction which causes film deposition. Note that, in some embodiments, the plasma feed gas is also used as a purge gas for removing unadsorbed film precursor (reactant) from the vicinity of the different process stations, when appropriate. Thus, while the curtain gas could (and typically would) be flowed continuously into the processing station during all the ALD cycle operations (such as operations (i)-(iv) above), the plasma feed gas would typically only be flowed to the processing chamber—and, more specifically, to the process stations—during the plasma activation (and purge operations if also used as a purge gas) while they are carried out at the specific process stations.

Note also that, depending on the embodiment, the flow rate of curtain gas into the process chamber may be different than the flow rate of plasma feed gas into the process chamber. In some embodiments, the plasma feed gas may be flowed into the process chamber at each station at a rate of about 5 to 50 standard liters/minute (SLM) per station, or more particularly about 10 to 35 SLM per station, or yet more particularly about 15 to 20 SLM per station. In some embodiments, the curtain gas may be flowed into the process chamber at a rate of about 3 to 60 SLM per station, or more particularly about 10 to 50 SLM per station, or yet more particularly about 15 to 40 SLM per station, or still more particularly about 20 to 30 SLM per station. Such curtain gas flow rates reduce (and/or prevent) back-diffusion of reactant and plasma feed gases from the vicinity of the process stations to remote areas of the processing chamber (such as the showerhead backsides).

In some embodiments, multi-station film deposition apparatuses may employ chandelier-type showerheads, one associated with each process station. Such chandelier showerheads may generally include a head portion and stem portion, the bottom surface of the head portion providing apertures for flowing film precursor (e.g., for substrate surface adsorption in ALD operation (i) above), plasma feed gas (e.g., for plasma activation in ALD operation (iii) above), and possibly a distinct purge gas into the processing chamber in the vicinity of each process station. The stem portion of the showerhead is present to support/hang the head portion above each process station within the processing chamber, and also to provide a fluidic path/connection for flowing film precursor (and/or other reactants), plasma feed gas, etc. to the apertures in the head portion. Generally, it is seen that chandelier-type showerhead designs allow for a good spatially uniform distribution of film precursor flow relative to the substrate surface, and improved in comparison to what would otherwise be achieved with just a few nozzles serving as point sources of flow.

In addition, such showerheads may also play a role in generating (and maintaining) the plasma at each process station which is used to activate the film-forming deposition reaction (e.g., in ALD operation (iii) above). In particular, upon application of a suitable electrical potential, each chandelier showerhead may serve as one of the two electrodes for plasma generation, the other electrode being the substrate holder (e.g., pedestal) between which the electrical potential is applied. The chandelier design allows positioning of the showerhead close to the substrate surface, which thereby allows for efficient plasma generation very close to the substrate as well as to provide a spatially uniform distribution of film precursor (reactant) close to the substrate. Note also that plasma generation in this manner (via chandelier—type showerhead) may provide a greater spatial separation between plasma and the grounded chamber walls which, again, allows for the use of higher powered plasmas (versus using a showerhead mounted flush with the chamber top wall, for example). In addition, as mentioned above, if the plasma feed gas is also used as a purge gas, then its introduction in the vicinity of the substrate allows for an efficient and effective purge of unadsorbed film precursor and/or reactant by-product (e.g., in ALD operations (ii) and (iv) above).

Because they are used for different purposes, the plasma feed gas and the curtain gas generally have different entry points into the processing chamber. While the plasma feed gas enters the chamber through apertures in the bottom surface of the head portions of the showerheads (as just described), the curtain gas may be introduced into the processing chamber from entry points suitable for its role in providing volumetric isolation for the various process stations (as well as potentially providing other benefits). For instance, for embodiments employing process-station-specific chandelier showerheads, the curtain gas may be released into the process chamber from behind the head portions of each of the chandelier showerheads, and in particular, in some embodiments, through apertures in the showerhead collars which surround the stem portions of the showerheads. Moreover, in certain such embodiments, the curtain gas may be flowed from these apertures in directions substantially parallel to the plane of the substrate and/or the bottom surfaces of the head portions, and thus, generally initially in directions perpendicular to the flow emanating from the bottom surface of the head of the showerhead. This flow of curtain gas may continue laterally until the curtain gas reaches the end of the backside of the showerhead (top surface of the head portion of the showerhead) at which point the curtain gas flow may turn downward, now parallel to the flow of plasma feed and/or purge gas from the head of the showerhead.

Figure 3A:
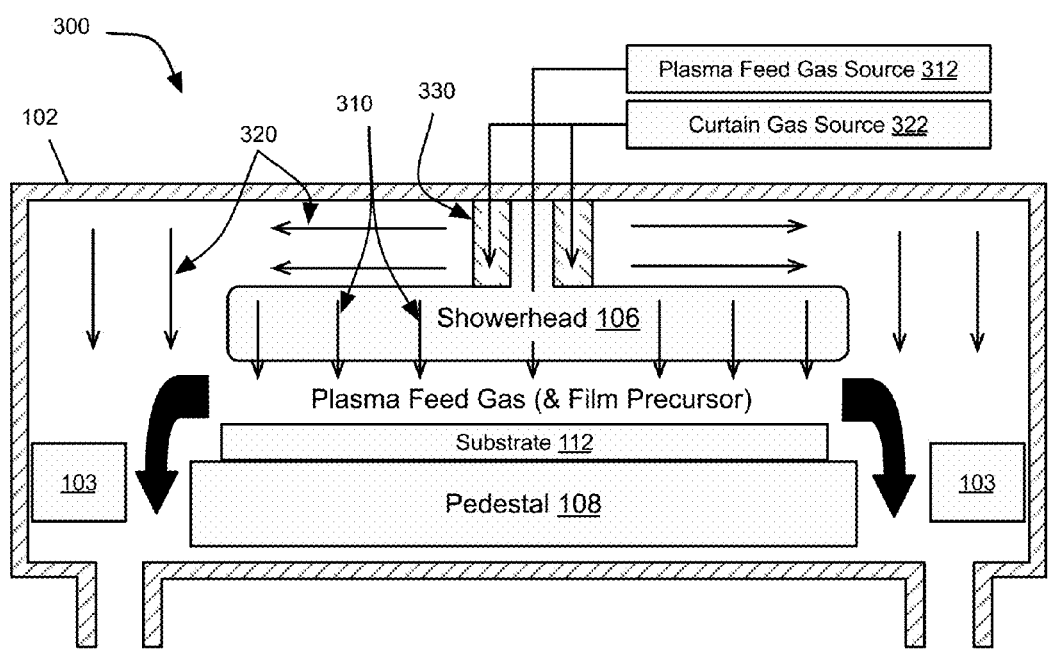
FIG. 3A is a cross-sectional schematic of a single-station processing chamber of a substrate processing apparatus employing a chandelier-type showerhead and an associated showerhead collar, and featuring plasma feed and curtain gas flow paths.

As described, in a multi-station processing chamber, this flow pattern of curtain gas may be used to provide volumetric separation between process stations; however, even in the context of a single process station embodiment, there may be attendant advantages in establishing curtain gas flow from behind the head portion of the showerhead. To illustrate such a flow pattern—first in the simpler context of a single process station embodiment—FIG. 3A presents a cross-sectional schematic of a single-station substrate processing apparatus 300 having a processing chamber 102, a showerhead 106 and showerhead collar 330, and featuring curtain gas flow paths 310, and plasma feed gas (and reactant precursor) flow paths 320. In the configuration shown in FIG. 3A, consistent with the foregoing description, plasma feed gas from plasma feed gas source 312 is flowed into chamber 102 through the bottom surface of the head portion of showerhead 106, while curtain gas from curtain gas source 322 is flowed into chamber 102 through apertures in the showerhead collar 330 which surrounds the stem portion of showerhead 106. Thus, the curtain gas here (note the descriptive phrase "curtain gas" is retained, even in the single station context) is introduced into the processing chamber 102 near to the center axis of the backside of the showerhead 106 and introduced with a flow substantially parallel to the plane of the substrate 112 held on pedestal 108 (and substantially parallel to the bottom surface of the head portion of the showerhead 106). The curtain gas so introduced then proceeds to flow around the showerhead and down the chamber sidewalls before exiting the chamber in the vicinity of cross-plates 103 (as schematically illustrated by the arrows in FIG. 3A).

Even in the single-process station scenario, the flow of curtain gas directly into the space/cavity behind/above the showerhead may be quite beneficial in that it may minimize or prevent undesirable deposition at the backside of the showerhead and on chamber walls behind/above the showerhead, etc. Likewise, the flow of curtain gas down the sidewalls may work to reduce and/or prevent deposition on the interior walls of chamber 102. In some examples, the flow of curtain gas into the cavity behind a chandelier-type showerhead may satisfy a Peclet condition (typically a Peclet number greater than one) so that back diffusion (or backflow) of film precursor form the bottom surface of the showerhead into said cavity is reduced and/or prevented. A further benefit—again, even in the single-process station context—is that establishing a flow of curtain gas, prior to the introduction of film precursor, (in addition to reducing or preventing potential spurious deposition on the showerhead backside and on the chamber walls) may establish the desired chamber pressure for the reactive film deposition process, avoiding wastefully establishing the appropriate chamber pressure with an excess of expensive film precursor. I.e., the higher chamber pressure acts as an air curtain for the film precursor and thus increases the partial pressure of precursor in the substrate region while reducing precursor partial pressure elsewhere. Thus, even in the single process station embodiment, a flow of curtain gas from the showerhead backside reduces the effective chamber volume, while reducing unwanted deposition on chamber sidewalls and on the backside of the showerhead.

Figure 3B:
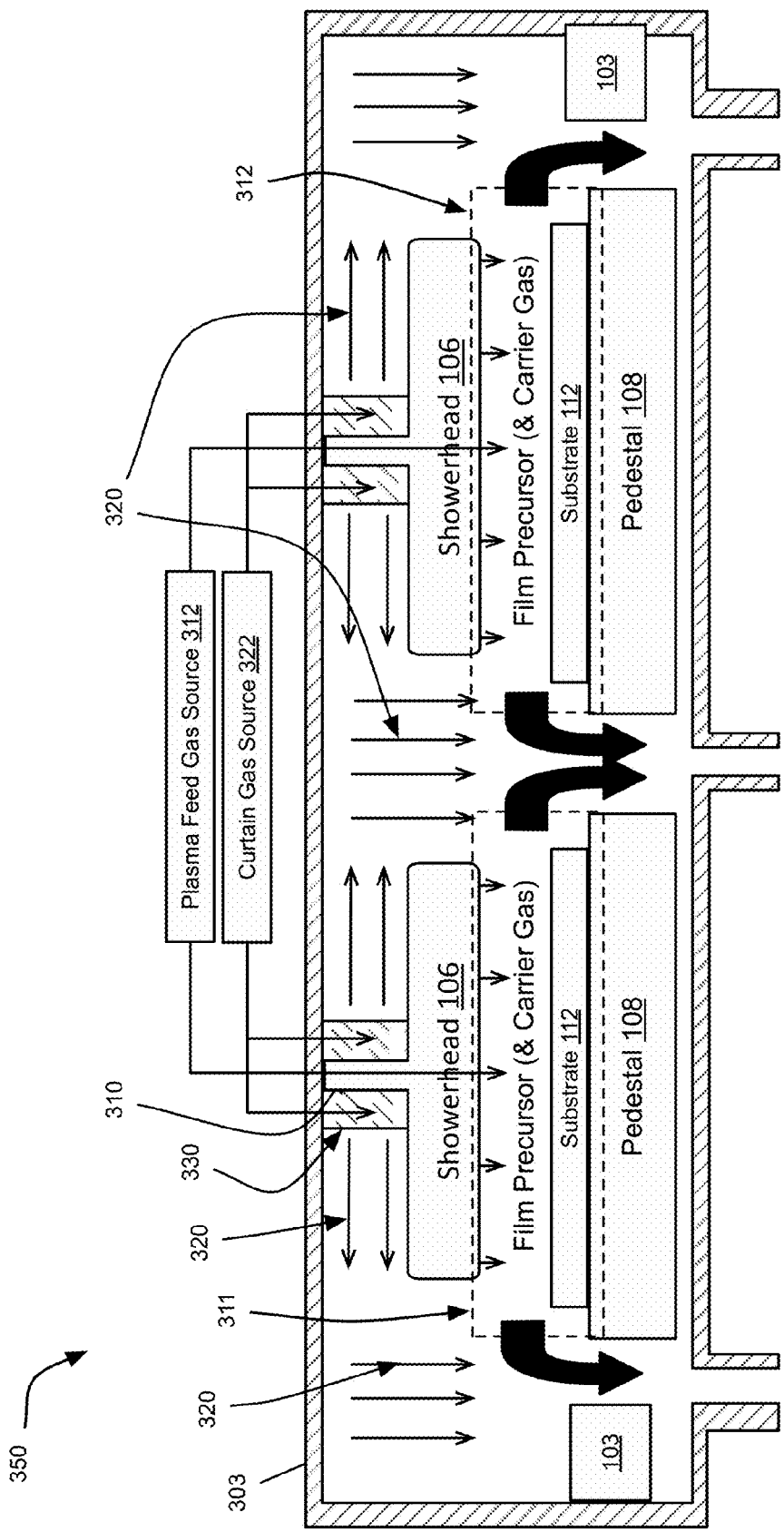
FIG. 3B is a cross-sectional schematic of a dual-station processing chamber of a substrate processing apparatus, each station having a substrate holder, a chandelier-type showerhead and an associated showerhead collar.

As discussed though, in a multi-station substrate processing chamber, the curtain gas may additionally provide volumetric isolation between process stations. FIG. 3B schematically illustrates a pair of process stations 311 and 312 (see dashed lines in FIG. 3B) within a multi-station processing chamber 303 of a processing apparatus 350. As illustrated in the figure by arrows indicative of the direction of gas flow, in addition to the curtain gas flow pattern shown in FIG. 3A (in the context of a single station), here the curtain gas 320 additionally flows between the process stations 311 and 312 volumetrically isolating them from one another. Note that this view shows a pair of process stations in cross section, so the view could represent a 2-station processing chamber embodiment, or it could represent a cross-sectional view of a 4-station processing chamber embodiment, such as that schematically illustrated in FIG. 2. In any event, each process station of the pair shown are analogous to the single process station shown in FIG. 3A, and thus the description accompanying FIG. 3A (as well as reference numbering), applies to FIG. 3B as well where appropriate, the most important difference being that in FIG. 3B there are a pair of process stations 311 and 312, and the pair are volumetrically isolated/separated from each other by the flow of curtain gas 320.

Certain benefits associated with the use of a curtain gas are particularly manifest in ALD process operations. For instance, curtain gas may be laterally released at the showerhead backside continuously throughout the phases/operations of an ALD cycle. Thus, while the plasma feed gas is only flowed from the showerhead during certain ALD operations—such as the plasma activation step (ALD operation (iii) above) and possibly if used as a purge gas during the post-precursor dose removal step (ALD operation (ii) above)—the curtain gas may be flowed continuously, directing curtain gas to remote areas of the chamber throughout ALD operations. Flow of the curtain gas to remote areas of the chamber—i.e., regions not in the immediate vicinity of the substrate surface—helps to remove excess unadsorbed film precursor from the processing chamber and, moreover, may even help to prevent film precursor from flowing to these remote regions of the chamber in the first instance. Again, to effect the latter, the curtain gas would then also be actively flowed during the ALD precursor dose operation (ALD operation (i) above) when film precursor is flowed to the chamber (and adsorbed on the substrate). Likewise, employment of curtain gas during plasma activation (operation (iii)) protects the interior surfaces of the chamber from any spurious deposition which might occur as a result of precursor becoming desorbed from the substrate surface during the reactive process occurring there, and then becoming re-adsorbed and reacting elsewhere, such as on the chamber sidewalls.

Figure 4:
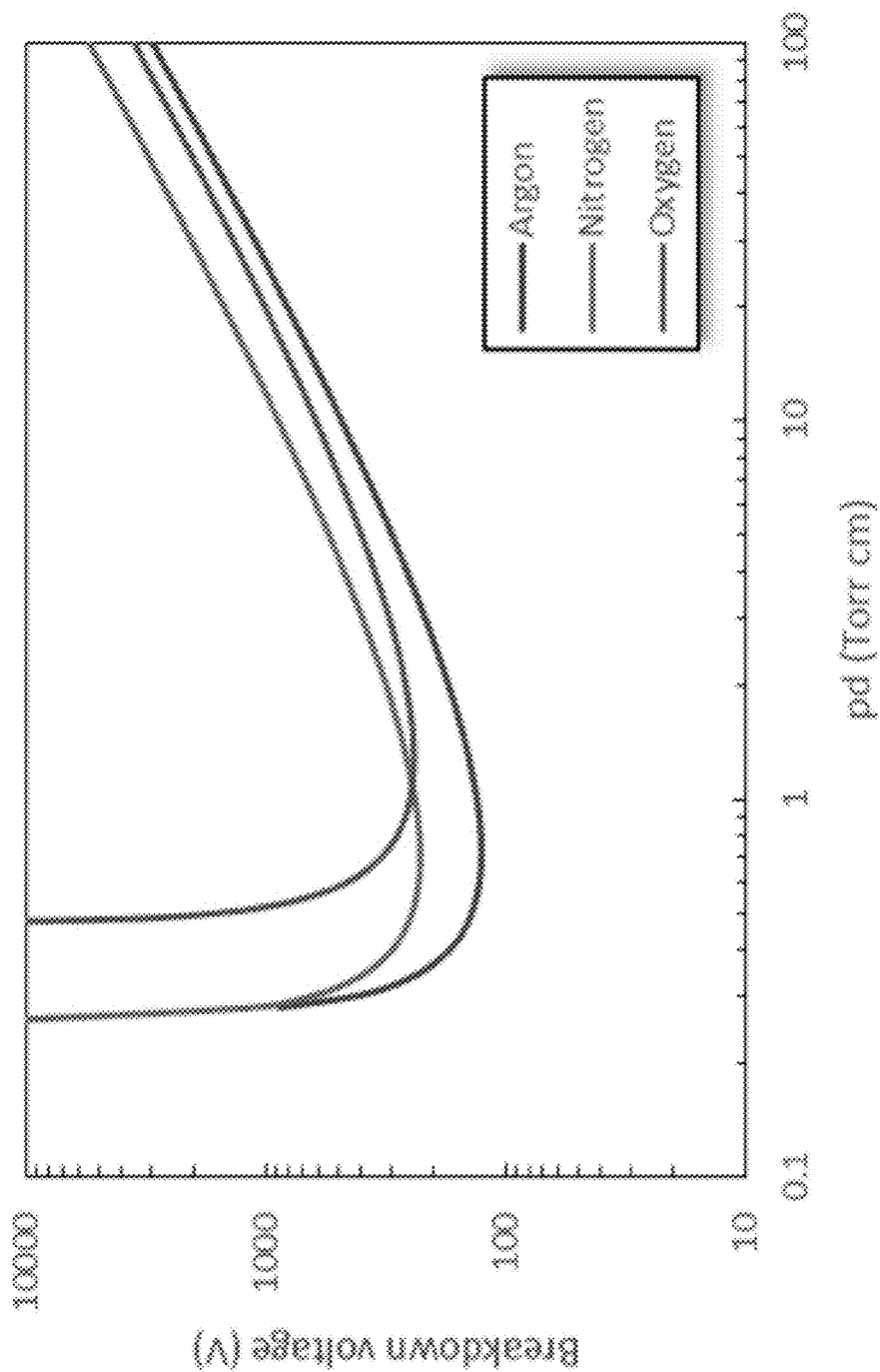
FIG. 4 is a Paschen curve showing breakdown voltage as a function of pd (chamber pressure-gap product) for molecular oxygen, molecular nitrogen, and argon.

It is noted that suitable chandelier showerheads employable for providing plasma feed gas and curtain gas in a multi-station processing chamber—schematically similar to that illustrated in FIGS. 3 and 4—are described in greater detail below with respect to FIGS. 6-9. The introduction of gas to a processing chamber from behind the head of a chandelier-type showerhead, and details of associated apparatuses are also described in prior U.S. patent application Ser. No. 13/659,231, filed Oct. 24, 2012, titled "SUPPRESSION OF PARASITIC DEPOSITION IN A SUBSTRATE PROCESSING SYSTEM BY SUPPRESSING PRECURSOR FLOW AND PLASMA OUTSIDE OF SUBSTRATE REGION," published as US Pat. Pub. No. 2013/0344245 hereby incorporated by reference in its entirety and for all purposes.

Reducing Parasitic Plasma Generation in Methods and Apparatuses Employing a Curtain Gas for Process Station Isolation In some methods of plasma-activated film deposition, such as plasma-activated ALD, it may be desirable to keep the curtain gas flowing during the plasma activation step(s). If a flow of curtain gas is maintained during this step, an inert gas is typically chosen so as not to interfere with the film-forming reaction. In previous work, $N_2$ was often chosen as the curtain gas. However, in certain applications, such as double-patterning, the nitrogen content of the deposited film must be critically controlled, and because use of $N_2$ as a curtain gas often leads to nitrogen incorporation into the deposited film, oftentimes it is a poor choice.

However, experiments with argon (Ar) have revealed that it too is less than ideal as a curtain gas, albeit for different reasons than $N_2$. For instance, in a plasma-activated ALD process, if the flow of curtain gas is maintained (as just discussed) during the film-forming plasma-activation step (ALD operation (iii) above), then the curtain gas has the potential to be ionized by the same RF field which generates the main (surface reaction-activating) plasma. This ionized curtain gas then constitutes what may be referred to as a parasitic plasma; the parasitic plasma is unintended, typically being maintained in remote areas of the chamber and potentially causing unwanted deposition reactions in these remote areas. For instance, it has been discovered that, in apparatuses employing chandelier-type showerheads, the dispensing of the curtain gas from above/behind the showerheads—such as from showerhead collars which surround the stem portion of the showerheads—results in the generation of a parasitic plasma in the regions behind/above the showerheads. Further, it has been observed that the parasitic plasma so-generated is actually very bright, and thus presumably very dense and strong. Moreover, because the volume of the region between the top of the showerhead and the top wall/ceiling of the processing chamber is rather sizeable, this parasitic plasma may be quite large volumetrically; in conjunction with the fact that it has a high plasma density, this parasitic plasma may thus draw a significant amount of power away from the main plasma used to activate the film-forming reaction on the substrate.

Formation of a parasitic plasma is thus undesirable for a variety of reasons: A parasitic plasma is an "uncontrolled" power sink, potentially drawing power from the main plasma and depressing its density. Moreover, since the density and power-draw of the parasitic plasma may vary based on a variety of factors, its affect on the main plasma (which activates the film forming reaction) may also be varying as well as unpredictable, and so may be a significant factor contributing to wafer-to-wafer variability. In addition, as stated, a parasitic plasma can result in spurious deposition on chamber wall surfaces, and it is possible that said deposition may act as a source of particles contaminating the deposited film on the substrate. Thus, operation with a strong/dense parasitic plasma likely leads to undesirable long term issues with wafer-to-wafer repeatability, tool drift, process particle performance, increased erosion of showerhead components and/or other chamber components, and/or other productivity problems, and therefore, to prevent/minimize these undesirable consequences, the partial or complete suppression/elimination of parasitic plasma generation in an ALD process system is an important goal.

One approach to resolving this issue is to judiciously choose a curtain gas which does not easily form a strong plasma (or a plasma at all) and yet still does not interfere with the film-forming reaction (e.g., in ALD operation (iii) above) or alter the content of the film in an adverse manner. One such choice is molecular oxygen ($O_2$). When $O_2$ is used as the curtain gas—retaining Ar as the plasma feed gas—it has been found that any parasitic plasma generated in remote areas of the chamber—such as above and behind the chandelier showerheads associated with each process station—is much weaker relative to what would have been generated had Ar been retained as both the plasma feed and curtain gases.

Without being limited to a particular theory, it is thought that the reason for the comparative weakness of the parasitic plasma when $O_2$ is used relative to Ar is due to $O_2$ having a high breakdown voltage. FIG. 4 presents a Paschen curve (in the form of a log-log plot) showing breakdown voltage for molecular oxygen, molecular nitrogen, and argon as a function of pd (chamber pressure-gap product, where the gap is the distance between the electrical plates used to generate the plasma, in this case, the showerhead and the pedestal). The figure illustrates that, over the range of pd shown in the plot, molecular oxygen (and molecular nitrogen) have a higher breakdown than argon. For example, the breakdown voltage for molecular oxygen at pd=3.4 Torr-cm (say corresponding to a 2 Torr chamber pressure and a pedestal/showerhead separation distance of 1.7 cm) is about 350V (as shown in the figure), whereas (as also shown in the figure) the breakdown voltage for argon, for this same pd is less than 200V. It is thus thought that, for this reason, plasmas based on $O_2$ have been found to have low electron densities for a given sustaining RF power relative to other types of plasmas (such as Ar-based plasmas), and thus one may generally refer to them as "weak plasmas." As such, in the plasma-activation step of an ALD cycle, the RF power and showerhead voltages used to generate/ignite an Ar plasma between the showerhead and the substrate are insufficient to generate/ignite an $O_2$ plasma in the cavity above the showerhead, or if there is some ignition, the $O_2$ plasma will be very weak (and visibly dim). With regards to the other characteristic mentioned above of a preferred curtain gas, it is noted that, unlike $N_2$, the presence of Ar and $O_2$ gas in the substrate processing chamber is compatible with typical plasma-activated ALD oxide surface reactions; in fact, the presence of some $O_2$ during deposition has been actually found to improve deposited film quality (at least in some embodiments). U.S. patent application Ser. No. 14/447,203, filed Jul. 30, 2014, and titled "METHODS AND APPARATUSES FOR SHOWERHEAD BACKSIDE PARASITIC PLASMA SUPPRESSION IN A SECONDARY PURGE ENABLED ALD SYSTEM," incorporated by reference herein in its entirety for all purposes, provides further details regarding the advantages of using $O_2$ as a curtain gas and/or secondary purge gas (in the language of that reference).

Generalizing the foregoing analysis, one concludes that chemical species having a high breakdown voltage relative to Ar (such as $O_2$)—or relative to other species used to support the main reaction-activating plasma (e.g, in ALD operation (iii) above)—may be good candidates for use as a curtain gas. Thus, for an Ar-based plasma, a suitable curtain gas contains a high-breakdown voltage species having a breakdown voltage of at least about 200 V for a pressure-distance (pd) value of 3.4 Torr-cm, or more particularly at least about 250 V, or at least about 300 V, or at least about 350 V, or even at least about 400 V (each recited voltage corresponding to the pd value of 3.4 Torr-cm). The plasma feed gas may also contain the high-breakdown voltage species but, depending on the embodiment, the curtain gas may have a higher concentration of said high-breakdown voltage species than the plasma feed gases.

The high-breakdown voltage species, though, in either or both of the curtain and plasma-feed gases, must also be compatible with the film-forming reaction and desired characteristics of the deposited film. Thus, in the context of oxide film deposition, a good choice for the high-breakdown voltage species is $O_2$. Likewise, for nitride film deposition, molecular nitrogen ($N_2$) is a good choice, as also illustrated by the Paschen curve shown in FIG. 4.

Reducing Main Plasma Non-Uniformity in Methods and Apparatuses Employing a Curtain Gas for Process Station Isolation While use of molecular oxygen ($O_2$) as a curtain gas for process station isolation deals with the problem of parasitic plasma generation generally associated with the use of an inert gas having a low breakdown voltage—argon (Ar) being one example (as described above)—there are unfortunately other issues which have been discovered to arise as a result of this choice.

One issue is the ability to maintain the uniformity of the main plasma used to activate the film deposition reaction in the presence of a continuous flow of $O_2$ curtain gas. As shown in FIG. 5A, in some embodiments where a chandelier showerhead is employed, the curtain gas is flowed from the backside of the showerhead and downward along the circumference of the process station (associated with that showerhead) in order to volumetrically isolate it. However, as depicted in FIG. 5A, although most of the curtain gas flow does flow around the process station, there will generally be some back-diffusion of the curtain gas into the volumetric region associated with the process station where the main reaction-activating plasma will be formed (e.g., during ALD operation (iii) above). Moreover, if the chemical composition of the curtain gas is too different from the chemical composition of the main plasma, then the presence of the curtain gas (in some non-negligible concentration) will alter the strength of the main plasma in a spatially non-uniform manner (e.g., it may suppress the strength of the main plasma in the edge regions of the substrate as depicted in FIG. 5A).

For example, if a mixture of argon (Ar) and molecular oxygen ($O_2$) is used as the plasma feed gas (to support the main plasma) and pure molecular oxygen ($O_2$) is used as the curtain gas, then the gas composition in the volumetric region of the process station near the edge of the substrate may have a higher concentration of $O_2$ than the plasma feed gas composition towards the center volumetric region of the process station. In some cases, there may be a gradient in $O_2$ concentration from the volumetric edge to the volumetric center of the process station. In any event, this radially varying concentration may cause plasma inhomogeneity, the plasma inhomogeneity in turn leading to variations in deposited film thickness and degraded deposited film uniformity.

Figure 5B:
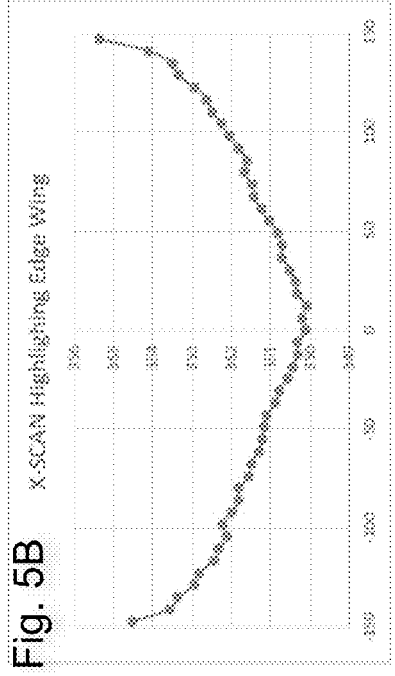
FIG. 5B is a plot of deposited film thickness across a wafer substrate when pure $O_2$ is used as the curtain gas.

An example is shown in FIG. 5B, which illustrates the across-wafer variation in deposited film thickness if pure $O_2$ is used as the curtain gas. The cross-section shown in FIG. 5B exhibits a general center-to-edge (radial) variation in thickness and a very pronounced "edge wing" in radial thickness variation right at the 1.8 mm wafer edge ring zone (and as a result, in this example, the total deposited film thickness varies from about 350 Å center to 355 Å edge). The edge variation is caused by the intrusion of curtain gas as shown in FIG. 5A, and it is noted that such edge variations are exacerbated by the higher flow rates typically employed for the curtain gas (generally set at around 15 SLM or greater per process station, as determined by Peclet number calculations)—which are actually used to reduce backflow of precursor away from the process station.

Figure 5D:
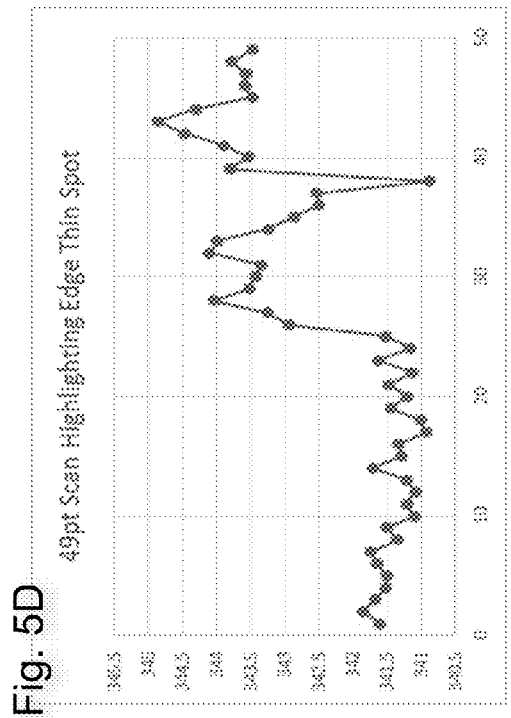
FIG. 5D plots a 49-point scan of azimuthal non-uniformity in deposited film thickness when pure $O_2$ is used as the curtain gas, with points 1-25 taken from the interior region of the wafer surface, and points 26-49 taken from the edge region around the wafer's circumference.
Figure 5A:
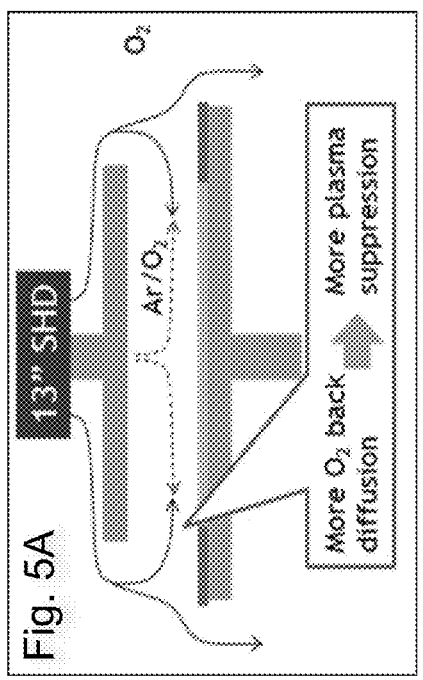
FIG. 5A is a cross-sectional schematic illustrating flows of plasma feed gas and curtain gas in the vicinity of a single process station.
Figure 5C:
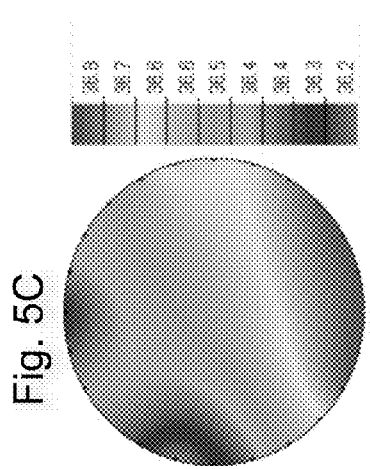
FIG. 5C displays a "heat map" of deposited film thickness over a substantially circularly-shaped substrate surface when pure $O_2$ is used as the curtain gas.

FIGS. 5C and 5D further illustrate various other aspects of deposited film non-uniformity which result from curtain gas intrusion. In particular, FIGS. 5C and 5D show that, in addition to radial thickness non-uniformity (as shown in FIG. 5B), plasma inhomogeneity caused by the intrusion of the curtain gas can also lead to azimuthal thickness non-uniformity. Without being limited to a particular theory, it is thought that the azimuthal variability which arises from composition inhomogeneity occurs to a significant extent because the plasma gas compositional variation tends to amplify any variations in plasma density which would be nominally present anyway due to sheath bending and chamber electrostatic/geometric effects. For instance, electrostatic/geometric effects may be caused by the asymmetry of the processing chamber relative to a particular process station. E.g., in a roughly square-shaped 4-station processing chamber (such as that shown in FIG. 2), on two sides of any station, there are (conductive) chamber walls, whereas on the other two sides the process station borders the interior of the processing chamber (and any auxiliary hardware present therein). This sort of spatial asymmetry results in plasma non-uniformity even in the absence of compositional inhomogeneity, but as stated, compositional inhomogeneity is thought to amplify it.

For instance, FIG. 5C displays a heat map of deposited film thickness over a substantially circularly-shaped substrate surface, and substantial azimuthal non-uniformities are clearly exhibited. They take the form of the straight band-shaped non-uniformity at the base of the figure which results from the effects of the chamber walls on plasma density; and also the two circular-shaped thickness non-uniformities at the top and left of the substrate surface resulting from plasma coupling to the spindle hub, which is a feature at the geometric center of the chamber, as well as coupling with some ceramic pieces/gaps beneath the chamber.

Likewise, FIG. 5D illustrates azimuthal non-uniformity via 49-point measurements of film thickness on the wafer surface. Points 1-25 in the figure are taken from the interior region of the wafer surface, whereas points 26-49 are taken from the edge region around the wafer's circumference. Note that the deposited film at interior points 1-25 is generally thinner than the deposited film at edge points 26-49, consistent with the film thickness cross-section shown in FIG. 5B. The figure illustrates the susceptibility of the wafer notch or the edge ring to "thin spots" at higher power processes (typically >1500 W), as shown by the severe drop in deposited film thickness at point 38 of the 49 point scan.

Collectively, FIGS. 5A-5D thus illustrate a variety of non-uniformities in deposited film thickness which result from the inhomogeneities in plasma density caused by curtain gas intrusion. One strategy for addressing these issues is to attempt to match the plasma strengths of the plasma feed gas and the curtain gas such that they are roughly comparable with each other if each were similarly ionized. This may be done by choosing the gas compositions of the plasma and curtain gases to be more closely matched to one another. However, it is also important that these compositions are selected so as not to compromise (at least not to too great a degree) the other considerations discussed above: e.g., that the plasma feed gas is compatible with the film-forming deposition reaction, and that the curtain gas is not ionized into a strong parasitic plasma in the presence of the RF energy used to generate the main plasma.

In this regard, it has been found in the context of dielectric oxide deposition that a fairly significant $O_2$ concentration in the plasma feed gas does not substantially compromise the performance of oxide deposition processes so long as there is enough argon (Ar) present to densify the deposited film (via ion bombardment), while a fairly significant Ar concentration in the curtain gas, if accompanied by a significant fraction of $O_2$, does not lead to significant parasitic plasma generation. In other words, one may only need enough $O_2$ present to bring suppressive effects to an otherwise low-breakdown voltage and sensitive Ar gas, and this $O_2$ concentration may be just about 5% by mole fraction (or about 15%, or about 25%, depending on the embodiment). It is noted that an $O_2$ composition lower than about 5% may often lead to plasma electrical discharge fluctuations sometimes called striations or plasmoids, and that these fluctuations may have a negative impact on film uniformity and process repeatability. However, using the higher concentrations of $O_2$ in $O_2$:Ar mixtures as just stated may achieve fast monolayer oxidation ($O_2$ component) with intense ion bombardment (Ar component) promoting good film densification.

Thus one solution is to attempt to match the argon and molecular oxygen fractions in the plasma feed gas and curtain gas to balance these various considerations, and in practice it has been found that this may be done by choosing the $O_2$ concentration in the curtain gas to be slightly higher than the $O_2$ concentration in the plasma feed gas. More generally, a strategy is to employ a plasma feed gas and a curtain gas which each have a substantial concentration of a chemical species having a high-breakdown voltage so that the curtain gas resists the formation of a parasitic plasma (in remote areas of the chamber away from the reaction stations), but that there is enough of the high-breakdown voltage species in the plasma feed gas so that its composition is not so different from the curtain gas so as to cause substantial non-uniformities in deposited film thickness.

Accordingly, following the foregoing principles, methods of performing plasma-activated film deposition in a multi-station processing chamber which make use of a curtain gas (for volumetrically isolating the various process stations from each other) may, in particular, employ a curtain gas which includes a high-breakdown voltage species (for the prevention of parasitic plasma generation) in a concentration that is higher than the concentration of the same species in the plasma feed gas used to support the main plasma (for activating the deposition reaction). Thus, in the context of a substrate processing apparatus with a processing chamber having (at least) first and second process stations, these deposition methods may include volumetrically isolating the first process station from the second process station by flowing a curtain gas between them, and while this is done, igniting first and second plasmas supported by first and second plasma feed gases at the first and second process stations, respectively, to cause activation of film deposition reactions at the first and second process stations. (Note, the first and second plasma feed gases (as well as the first and second plasmas) may be compositionally identical, the distinction being that the first plasma feed gas corresponds to the first process station, and the second to the second process station.)

As stated, the concentration of high-breakdown voltage species in the curtain gas may be higher than in the first and second plasma feed gases. In some embodiments, the high-breakdown voltage species may make up about 5% to 50% of the curtain gas by mole fraction, or more particularly about 5% to 25% of the curtain gas by mole fraction, or yet more particularly about 5% to 15%. Likewise, in some embodiments, the high-breakdown voltage species may make up about 5% to 50% of the first and second plasma feed gases by mole fraction, or more particularly about 5% to 25% of the first and second plasma feed gases by mole fraction, or yet more particularly about 5% to 15%, but in some embodiments, still a lower concentration than in the curtain gas.

In certain such embodiments, as stated, the other component of the plasma feed gases and the curtain gas may be an inert gas such as argon (Ar). In such an embodiment where $O_2$ is employed as the high-breakdown voltage species, the molar ratio of Ar to $O_2$ may be about 1:1 to 19:1 in the curtain gas and the first and second plasma feed gases, or more particularly a ratio of Ar to $O_2$ of about 3:1 to 19:1 in the curtain gas and the first and second plasma feed gases, but, in some embodiments, with a lower ratio (Ar to $O_2$) in the curtain gas than in the plasma feed gases.

In this manner, the curtain gas resists parasitic plasma formation, while the plasma feed and curtain gases have similar chemical compositions so as to ionize with similar strengths in the presence of RF energy, and as a result, the plasma strength of the main plasma (which activates the deposition process) will have good homogeneity, even near the edge of the substrates where mixing of curtain and main plasma feed gases may occur. Note that analogous methods may also be employed in processing chambers having 3 or 4 or 5 or 6 or 7 or 8 or 9 or 10 or 11 or 12 or 13 or 14 or 15 or even 16 processing stations.

Detailed Description of Atomic Layer Deposition Techniques and Deposited Films

As discussed above, as devices sizes continue to shrink and ICs move to employing 3-D transistors and other 3-D structures, the ability to deposit a precise amount (thickness) of conformal film material—dielectrics in particular, but also various dopant-containing materials—has become increasingly important. Atomic layer deposition is one technique for accomplishing conformal film deposition that typically involves multiple cycles of deposition in order to achieve a desired thickness of film.

In contrast with chemical vapor deposition (CVD) process, where activated gas phase reactions are used to deposit films, ALD processes use surface-mediated deposition reactions to deposit films on a layer-by-layer basis. For instance, in one class of ALD processes, a first film precursor (P1) is introduced in a processing chamber in the gas phase, is exposed to a substrate, and is allowed to adsorb onto the surface of the substrate (typically at a population of surface active sites). Some molecules of P1 may form a condensed phase atop the substrate surface, including chemisorbed species and physisorbed molecules of P1. The volume surrounding the substrate surface is then evacuated to remove gas phase and physisorbed P1 so that only chemisorbed species remain. A second film precursor (P2) may then be introduced into the processing chamber so that some molecules of P2 adsorb to the substrate surface. The volume surrounding the substrate within the processing chamber may again be evacuated, this time to remove unbound P2. Subsequently, energy provided to the substrate (e.g., thermal or plasma energy) activates surface reactions between the adsorbed molecules of P1 and P2, forming a film layer. Finally, the volume surrounding the substrate is again evacuated to remove unreacted P1 and/or P2 and/or reaction by-product, if present, ending a single cycle of ALD.

ALD techniques for depositing conformal films having a variety of chemistries—and also many variations on the basic ALD process sequence—are described in detail in U.S. patent application Ser. No. 13/084,399, filed Apr. 11, 2011, titled "PLASMA ACTIVATED CONFORMAL FILM DEPOSITION", U.S. patent application Ser. No. 13/242,084, filed Sep. 23, 2011, titled "PLASMA ACTIVATED CONFORMAL DIELECTRIC FILM DEPOSITION," now U.S. Pat. No. 8,637,411, U.S. patent application Ser. No. 13/224,240, filed Sep. 1, 2011, titled "PLASMA ACTIVATED CONFORMAL DIELECTRIC FILM DEPOSITION", and U.S. patent application Ser. No. 13/607,386, filed Sep. 7, 2012, titled "CONFORMAL DOPING VIA PLASMA ACTIVATED ATOMIC LAYER DEPOSITION AND CONFORMAL FILM DEPOSITION", each of which is incorporated by reference herein in its entirety for all purposes. As described in these prior applications, a basic ALD cycle for depositing a single layer of material on a substrate may include: (i) adsorbing a film precursor onto a substrate at a process station such that it forms an adsorption-limited layer, (ii) removing, when present, unadsorbed precursor ("unadsorbed precursor" defined to include desorbed precursor) from the vicinity of the process station, (iii) reacting the adsorbed-precursor to form a layer of film on the substrate, and optionally (iv) removing desorbed film precursor and/or reaction by-product from the vicinity of the process station. The removing in operations (ii) and (iv) may be done via purging, evacuating, pumping down to a base pressure ("pump-to-base"), etc. the volume surrounding the substrate. In some embodiments, the purge gas may be the same as the main plasma feed gas. The foregoing sequence of operations (i) through (iv) represent a single ALD cycle resulting in the formation of a single layer of film. However, since an single layer of film formed via ALD is typically very thin—often it is only a single molecule thick—multiple ALD cycles are repeated in sequence to build up a film of appreciable thickness. Thus, if it is desired that a film of say N layers be deposited (or, equivalently, one might say N layers of film), then multiple ALD cycles (operations (i) through (iv)) may be repeated in sequence N times.

It is noted that this basic ALD sequence of operations (i) through (iv) doesn't necessary involve two chemiadsorbed reactive species P1 and P2 as in the example described above, nor does it even necessarily involve a second reactive species, although these possibilities/options may be employed, depending on the desired deposition chemistries involved.

Due to the adsorption-limited nature of ALD, however, a single cycle of ALD only deposits a thin film of material, and oftentimes only a single monolayer of material. For example, depending on the exposure time of the film precursor dosing operations and the sticking coefficients of the film precursors (to the substrate surface), each ALD cycle may deposit a film layer only about 0.5 to 3 Angstroms thick. Thus, the sequence of operations in a typical ALD cycle—operations (i) through (iv) just described—are generally repeated multiple times in order to form a conformal film of the desired thickness. Thus, in some embodiments, operations (i) through (iv) are repeated consecutively at least 1 time, or at least 2 times, or at least 3 times, or at least 5 times, or at least 7 times, or at least 10 times in a row. An ALD film may be deposited at a rate of about or between 0.1 Å and 2.5 Å per ALD cycle, or about or between 0.2 Å and 2.0 Å per ALD cycle, or about or between 0.3 Å and 1.8 Å per ALD cycle, or about or between 0.5 Å and 1.5 Å per ALD cycle, or about or between 0.1 Å and 1.5 Å per ALD cycle, or about or between 0.2 Å and 1.0 Å per ALD cycle, or about or between 0.3 Å and 1.0 Å per ALD cycle, or about or between 0.5 Å and 1.0 Å per ALD cycle.

In some film forming chemistries, an auxiliary reactant or co-reactant—in addition to what is referred to as the "film precursor"—may also be employed. In certain such embodiments, the auxiliary reactant or co-reactant may be flowed continuously during a subset of steps (i) through (iv) or throughout each of steps (i) through (iv) as they are repeated. In some embodiments, this other reactive chemical species (auxiliary reactant, co-reactant, etc.) may be adsorbed onto the substrate surface with the film precursor prior to its reaction with the film precursor (as in the example involving precursors P1 and P2 described above), however, in other embodiments, it may react with the adsorbed film precursor as it contacts it without prior adsorption onto the surface of the substrate, per se. Also, in some embodiments, operation (iii) of reacting the adsorbed film precursor may involve contacting the adsorbed film precursor with a plasma. The plasma may provide energy to drive the film-forming reaction on the substrate surface. In certain such embodiments, the plasma may be an oxidative plasma generated in the reaction chamber with application of suitable RF power (although in some embodiments, it may be generated remotely). In other embodiments, instead of an oxidative plasma, an inert plasma may be used. The oxidizing plasma may be formed from one or more oxidants such as $O_2$, $N_2O$, or $CO_2$, and may optionally include one or more diluents such as Ar, $N_2$, or He. In one embodiment, the oxidizing plasma is formed from $O_2$ and Ar. A suitable inert plasma may be formed from one or more inert gases such as He or Ar. Further variations on ALD processes are described in detail in the prior patent applications just cited (and which are incorporated by reference).

In some embodiments, a multi-layer deposited film may include regions/portions of alternating composition formed, for example, by conformally depositing multiple layers sequentially having one composition, and then conformally depositing multiple layers sequentially having another composition, and then potentially repeating and alternating these two sequences. Some of these aspects of deposited ALD films are described, for example, in U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION", which is incorporated by reference herein in its entirety for all purposes. Further examples of conformal films having portions of alternating composition—including films used for doping an underlying target IC structure or substrate region—as well as methods of forming these films, are described in detail in: U.S. patent application Ser. No. 13/084,399, filed Apr. 11, 2011, and titled "PLASMA ACTIVATED CONFORMAL FILM DEPOSITION"; U.S. patent application Ser. No. 13/242,084, filed Sep. 23, 2011, and titled "PLASMA ACTIVATED CONFORMAL DIELECTRIC FILM DEPOSITION," now U.S. Pat. No. 8,637,411; U.S. patent application Ser. No. 13/224,240, filed Sep. 1, 2011, and titled "PLASMA ACTIVATED CONFORMAL DIELECTRIC FILM DEPOSITION"; U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is incorporated by reference herein in its entirety for all purposes.

As detailed in the above referenced specifications, ALD processes are oftentimes used to deposit conformal silicon oxide films (SiOx), however ALD processes may also be used to deposit conformal dielectric films of other chemistries as also disclosed in the foregoing incorporated specifications. ALD-formed dielectric films may, in some embodiments, contain a silicon carbide (SiC) material, a silicon nitride (SiN) material, a silicon carbonitride (SiCN) material, or a combination thereof. Silicon-carbon-oxides and silicon-carbon-oxynitrides, and silicon-carbon-nitrides may also be formed in some embodiment ALD-formed films. Methods, techniques, and operations for depositing these types of films are described in detail in U.S. patent application Ser. No. 13/494,836, filed Jun. 12, 2012, titled "REMOTE PLASMA BASED DEPOSITION OF SiOC CLASS OF FILMS,"; U.S. patent application Ser. No. 13/907,699, filed May 31, 2013, titled "METHOD TO OBTAIN SiC CLASS OF FILMS OF DESIRED COMPOSITION AND FILM PROPERTIES,"; U.S. patent application Ser. No. 14/062,648, titled "GROUND STATE HYDROGEN RADICAL SOURCES FOR CHEMICAL VAPOR DEPOSITION OF SILICON-CARBON-CONTAINING FILMS"; and U.S. patent application Ser. No. 14/194,549, filed Feb. 28, 2014, and titled "CAPPED ALD FILMS FOR DOPING FIN-SHAPED CHANNEL REGIONS OF 3-D IC TRANSISTORS"; each of which is hereby incorporated by reference in its entirety and for all purposes.

Other examples of film deposition via ALD include chemistries for depositing dopant-containing films as described in the patent applications listed and incorporated by reference above (U.S. patent application Ser. Nos. 13/084,399, 13/242,084, 13/224,240, and 14/194,549). As described therein, various dopant-containing film precursors may be used for forming the dopant-containing films, such as films of boron-doped silicate glass (BSG), phosphorous-doped silicate glass (PSG), boron phosphorus doped silicate glass (BPSG), arsenic (As) doped silicate glass (ASG), and the like. The dopant-containing films may include $B_2O_3$, $B_2O$, $P_2O_5$, $P_2O_3$, $As_2O_3$, $As_2O_5$, and the like. Thus, dopant-containing films having dopants other than boron are feasible. Examples include gallium, phosphorous, or arsenic dopants, or other elements appropriate for doping a semiconductor substrate, such as other valence III and V elements.

As for ALD process conditions, ALD processes may be performed at various temperatures. In some embodiments, suitable temperatures within an ALD reaction chamber may range from between about 25° C. and 450° C., or between about 50° C. and 300° C., or between about 20° C. and 400° C., or between about 200° C. and 400° C., or between about 100° C. and 350° C.

Likewise, ALD processes may be performed at various ALD reaction chamber pressures. In some embodiments, suitable pressures within the reaction chamber may range from between about 10 mTorr and 10 Torr, or between about 20 mTorr and 8 Torr, or between about 50 mTorr and 5 Torr, or between about 100 mTorr and 2 Torr.

Various RF power levels may be employed to generate a plasma if used in operation (iii). In some embodiments, suitable RF power may range from between about 100 W and 10 kW, or between about 200 W and 6 kW, or between about 500 W, and 3 kW, or between about 1 kW and 2 kW.

Various film precursor flow rates may be employed in operation (i). In some embodiments, suitable flow rates may range from about or between 0.1 mL/min to 10 mL/min, or about or between 0.5 mL/min and 5 mL/min, or about or between 1 mL/min and 3 mL/min.

Various gas flow rates may be used in the various operations. In some embodiments, general gas flow rates may range from about or between 1 L/min and 20 L/min, or about or between 2 L/min and 10 L/min. For the optional inert purge steps in operations (ii) and (iv), an employed burst flow rate may range from about or between 20 L/min and 100 L/min, or about or between 40 L/min and 60 L/min.

Once again, in some embodiments, a pump-to-base step refers to pumping the reaction chamber to a base pressure by directly exposing it to one or more vacuum pumps. In some embodiments, the base pressure may typically be only a few milliTorr (e.g., between about 1 and 20 mTorr). Furthermore, as indicated above, a pump-to-base step may or may not be accompanied by an inert purge, and thus carrier gases may or may not be flowing when one or more valves open up the conductance path to the vacuum pump.

Also, once again, multiple ALD cycles may be repeated to build up stacks of conformal layers. In some embodiments, each layer may have substantially the same composition whereas in other embodiments, sequentially ALD deposited layers may have differing compositions, or in certain such embodiments, the composition may alternate from layer to layer or there may be a repeating sequence of layers having different compositions, as described above. Thus, depending on the embodiment, certain stack engineering concepts, such as those disclosed in the patent applications listed and incorporated by reference above (U.S. patent application Ser. Nos. 13/084,399, 13/242,084, and 13/224,240) may be used to modulate boron, phosphorus, or arsenic concentration in these films.

Detailed Description of Substrate Processing Apparatuses

The methods described herein may be performed with any suitable semiconductor substrate processing apparatus. A suitable apparatus includes hardware for accomplishing the process operations and a system controller having instructions for controlling process operations in accordance with the various channel doping methodologies disclosed herein. In some embodiments, the hardware may include one or more process stations included in a multi-station substrate processing tool, and a controller having (or having access to) machine-readable instructions for controlling process operations in accordance with the processing techniques disclosed herein.

Thus, in some embodiments, an apparatus suitable for depositing films of material on multiple semiconductor substrates may include a first set of one or more process stations each having a substrate holder contained in a processing chamber, a second set of one or more process stations each having a substrate holder contained in the processing chamber, one or more valves for controlling flow of film precursor to the process stations, and one or more valve-operated vacuum sources for removing film precursor from the volumes surrounding the process stations contained in the one or more processing chambers. And, such an apparatus may also include a controller having (or having access to) machine-readable instructions for operating the substrate loading device, the substrate transferring device, the one or more valves, and the vacuum source to deposit films of material onto the substrates.

Thus, in some embodiments, said instructions executed by the controller may include instructions for forming films on multiple substrates at multiple process stations contained in a processing chamber, wherein multiple layers of the film are formed on each substrate by a sequence of ALD cycles. Thus, in certain such embodiments, said instructions executed by the controller may include instructions for performing ALD operations (i) though (iv) as described above, and instructions for repeating ALD operations (i) through (iv) multiple times to form multiple layers of film on the multiple substrates at the multiple process stations of the substrate processing apparatus.

Accordingly, FIG. 1 schematically shows an embodiment of a substrate processing apparatus 100. For simplicity, processing apparatus 100 is depicted as a standalone process station having a process chamber body 102 for maintaining a low-pressure environment.

However, it will be appreciated that a plurality of process stations may be included in a common process tool environment—e.g., within a common reaction chamber—as described herein. For example, FIG. 2 depicts an embodiment of a multi-station processing tool. Further, it will be appreciated that, in some embodiments, one or more hardware parameters of processing apparatus 100, including those discussed in detail above, may be adjusted programmatically by one or more system controllers.

Process station 100 fluidly communicates with reactant delivery system 101 for delivering process gases to a distribution showerhead 106. Reactant delivery system 101 includes a mixing vessel 104 for blending and/or conditioning process gases for delivery to showerhead 106. One or more mixing vessel inlet valves 120 may control introduction of process gases to mixing vessel 104.

Some reactants may be stored in liquid form prior to vaporization and subsequent delivery to the process chamber 102. The embodiment of FIG. 1 includes a vaporization point 103 for vaporizing liquid reactant to be supplied to mixing vessel 104. In some embodiments, vaporization point 103 may be a heated liquid injection module. In some embodiments, vaporization point 103 may be a heated vaporizer. The saturated reactant vapor produced from such modules/vaporizers may condense in downstream delivery piping when adequate controls are not in place (e.g., when no helium is used in vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 103 may be heat treated. In some examples, mixing vessel 104 may also be heat treated. In one non-limiting example, piping downstream of vaporization point 103 has an increasing temperature profile extending from approximately 100° C. to approximately 150° C. at mixing vessel 104.

As mentioned, in some embodiments the vaporization point 103 may be a heated liquid injection module ("liquid injector" for short). Such a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 803. In one scenario, a liquid injector may be mounted directly to mixing vessel 804. In another scenario, a liquid injector may be mounted directly to showerhead 106.

In some embodiments, a liquid flow controller (LFC) upstream of vaporization point 103 may be provided for controlling a mass flow of liquid for vaporization and delivery to processing chamber 102. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 106 distributes process gases and/or reactants (e.g., film precursors) toward substrate 112 at the process station, the flow of which is controlled by one or more valves upstream from the showerhead (e.g., valves 120, 120A, 105). In the embodiment shown in FIG. 1, substrate 112 is located beneath showerhead 106, and is shown resting on a pedestal 108. It will be appreciated that showerhead 106 may have any suitable shape, and may have any suitable number and arrangement of ports for distributing processes gases to substrate 112.

In some embodiments, a microvolume 107 is located beneath showerhead 106. Performing an ALD process in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 108 may be raised or lowered to expose substrate 112 to microvolume 107 and/or to vary a volume of microvolume 107. For example, in a substrate transfer phase, pedestal 108 may be lowered to allow substrate 112 to be loaded onto pedestal 108. During a deposition on substrate process phase, pedestal 108 may be raised to position substrate 112 within microvolume 107. In some embodiments, microvolume 107 may completely enclose substrate 112 as well as a portion of pedestal 108 to create a region of high flow impedance during a deposition process.

Optionally, pedestal 108 may be lowered and/or raised during portions the deposition process to modulate process pressure, reactant concentration, etc. within microvolume 107. In one scenario where processing chamber body 102 remains at a base pressure during the process, lowering pedestal 108 may allow microvolume 107 to be evacuated. Example ratios of microvolume to process chamber volume include, but are not limited to, volume ratios between 1:500 and 1:10. It will be appreciated that, in some embodiments, pedestal height may be adjusted programmatically by a suitable system controller.

In another scenario, adjusting a height of pedestal 108 may allow a plasma density to be varied during plasma activation and/or treatment cycles included, for example, in an ALD or CVD process. At the conclusion of a deposition process phase, pedestal 108 may be lowered during another substrate transfer phase to allow removal of substrate 112 from pedestal 108.

While the example microvolume variations described herein refer to a height-adjustable pedestal, it will be appreciated that, in some embodiments, a position of showerhead 806 may be adjusted relative to pedestal 108 to vary a volume of microvolume 107. Further, it will be appreciated that a vertical position of pedestal 108 and/or showerhead 106 may be varied by any suitable mechanism within the scope of the present disclosure. In some embodiments, pedestal 108 may include a rotational axis for rotating an orientation of substrate 112. It will be appreciated that, in some embodiments, one or more of these example adjustments may be performed programmatically by one or more suitable system controllers having machine-readable instructions for performing all or a subset of the foregoing operations.

Returning to the embodiment shown in FIG. 1, showerhead 106 and pedestal 108 electrically communicate with RF power supply 114 and matching network 116 for powering a plasma. In some embodiments, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Examples of suitable powers are included above. Likewise, RF power supply 114 may provide RF power of any suitable frequency. In some embodiments, RF power supply 114 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy (OES) sensors. In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert (e.g., helium) and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 milliseconds to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD cycles.

In some embodiments, pedestal 108 may be temperature controlled via heater 110. Further, in some embodiments, pressure control for processing apparatus 100 may be provided by one or more valve-operated vacuum sources such as butterfly valve 118. As shown in the embodiment of FIG. 1, butterfly valve 118 throttles a vacuum provided by a downstream vacuum pump (not shown). However, in some embodiments, pressure control of processing apparatus 100 may also be adjusted by varying a flow rate of one or more gases introduced to processing chamber 102. In some embodiments, the one or more valve-operated vacuum sources—such as butterfly valve 118—may be used for removing film precursor from the volumes surrounding the process stations during the appropriate ALD operational phases.

As described above, one or more process stations may be included in a multi-station substrate processing tool. FIG. 2 schematically illustrates an example of a multi-station processing tool 200 which includes a plurality of process stations 201, 202, 203, 204 in a common low-pressure processing chamber 214. By maintaining each station in a low-pressure environment, defects caused by vacuum breaks between film deposition processes may be avoided.

As shown in FIG. 2, the multi-station processing tool 200 has a substrate loading port 220, and a substrate handler robot 226 configured to move substrates from a cassette loaded from a pod 228, through atmospheric port 220, into the processing chamber 214, and finally onto a process station. Specifically, in this case, the substrate handler robot 226 loads substrates at process stations 201 and 202, and a substrate transferring device, in this case substrate carousel 290, transfers substrates between the various process stations 201, 202, 203, and 204. In the embodiment shown in FIG. 2, the substrate loading device is depicted as substrate handler robot 226 having 2 arms for substrate manipulation, and so, as depicted, it could load substrates at both stations 201 and 202 (perhaps simultaneously, or perhaps sequentially). Then, after loading at stations 201 and 202, the substrate transferring device, carousel 290 depicted in FIG. 2, can do a 180 degree rotation (about its central axis, which is substantially perpendicular to the plane of the substrates (coming out of the page), and substantially equidistant between the substrates) to transfer the two substrates from stations 201 and 202 to stations 203 and 204. At this point, handler robot 226 can load 2 new substrates at stations 201 and 202, completing the loading process. To unload, these steps can be reversed, except that if multiple sets of 4 wafers are to be processed, each unloading of 2 substrates by handler robot 226 would be accompanied by the loading of 2 new substrates prior to rotating the transferring carousel 290 by 180 degrees. Analogously, a one-armed handler robot configured to place substrates at just 1 station, say 201, would be used in a 4 step load process accompanied by 4 rotations of carousel 290 by 90 degrees to load substrates at all 4 stations.

The depicted processing chamber 214 shown in FIG. 2 provides four process stations, 201, 202, 203, and 204. Each station has a heated pedestal (shown at 218 for process station 901) and gas line inlets. It will be appreciated that in some embodiments, each process station may have different or multiple purposes. For example, in some embodiments, a process station may be switchable between an ALD process mode and a CVD process mode. Additionally or alternatively, in some embodiments, processing chamber 214 may include one or more matched pairs of ALD/CVD process stations. While the depicted processing chamber 214 comprises 4 process stations, it will be understood that a processing chamber according to the present disclosure may have any suitable number of stations. For example, in some embodiments, a processing chamber may have 1, or 2, or 3, or 4, or 5, or 6, or 7, or 8, or 9, or 10, or 11, or 12, or 13, or 14, or 15, or 16, or more process stations (or a set of embodiments may be described as having a number of process stations per reaction chamber within a range defined by any pair of the foregoing values, such as having 2 to 6 process stations per reaction chamber, or 4 to 8 process stations per reaction chamber, or 8 to 16 process stations per reaction chamber, etc.).

As indicated above, FIG. 2 depicts an embodiment of a substrate transferring device 290 for transferring substrates between process stations 201, 202, 203, and 204 within processing chamber 214. It will be appreciated that any suitable substrate transferring device may be employed. Non-limiting examples include wafer carousels and substrate handler robots.

Detailed Description of Chandelier Showerheads and Showerhead Collars

Figure 6:
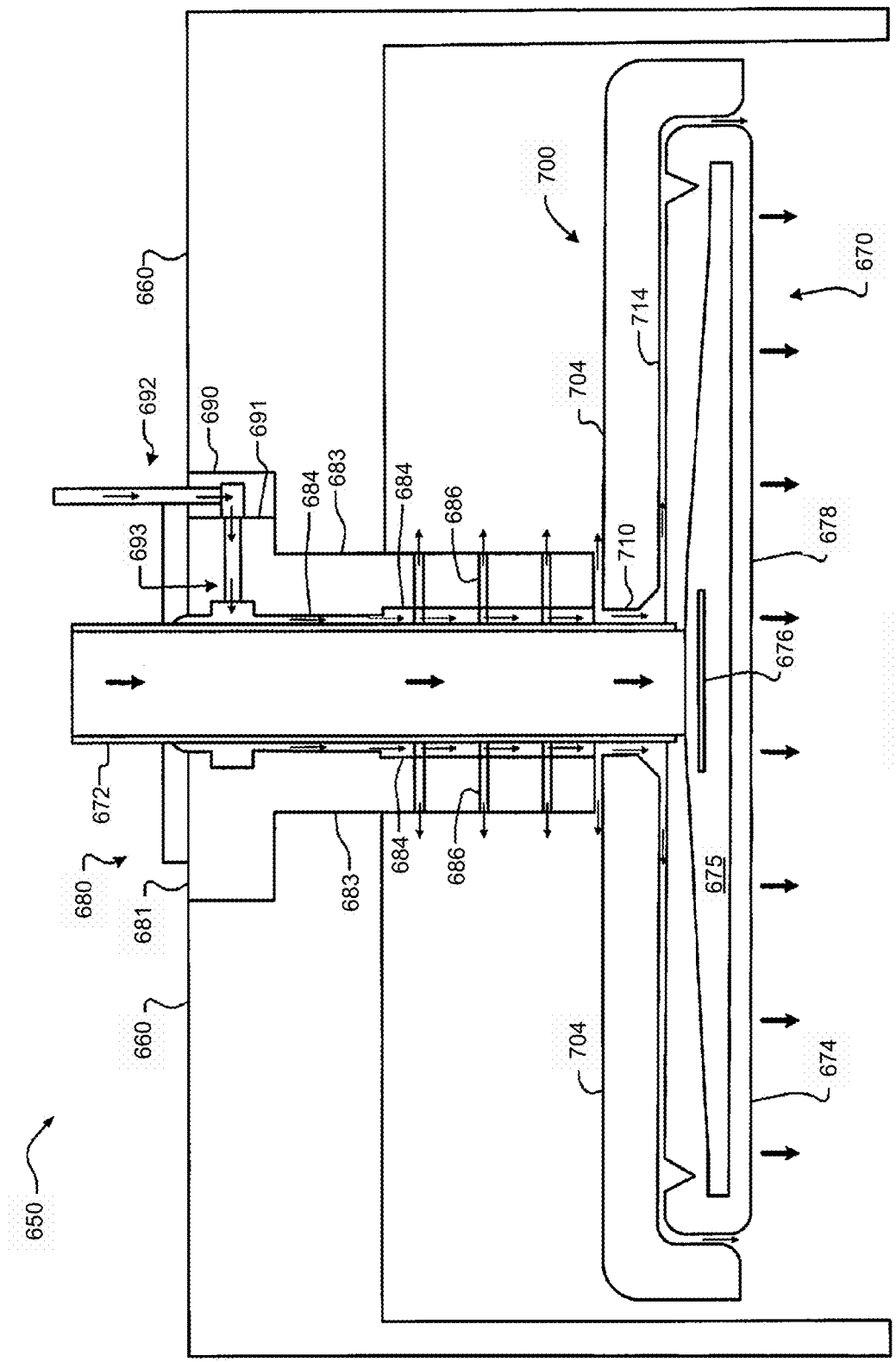
FIG. 6 is a more detailed cross-sectional view of a showerhead and showerhead collar in a substrate processing chamber also illustrating primary and secondary purge flow paths.

In ALD processes, the film precursor generally needs to be alternatively present in the reaction chamber and then evacuated. To prevent parasitic deposition, the excess precursor in the processing chamber is removed from the processing chamber and the shared precursor pathways (such as within the stem of the showerhead) before introducing the next precursor. The removal of excess precursor is usually done by purging the delivery pathway and chamber with inert gas. When using a chandelier-type showerhead, however, the purge gas (which may be the same as the plasma feed gas) flowed to the chamber from the bottom surface of the head of the showerhead may not able to effectively remove the excess precursor present at the back of and/or behind the showerhead, around the stem, for example. Therefore, an appreciable amount of parasitic deposition may occur behind the showerhead, on the top plate, and/or on the processing chamber wall. It is not generally feasible and/or desirable to fill the dead space at the back of and/or behind the showerhead with solid dielectric since this often/likely causes RF coupling to ground. Hence, as described above, the curtain gas—whose primary purpose is to be flowed between process stations and thereby provide a degree of volumetric separation between them—may be introduced to the processing chamber behind the showerhead so that in addition to providing said volumetric separation, the flow of curtain gas may also work to prevent parasitic deposition behind the showerhead. Hardware for implementing such a release of curtain gas will now be described in detail:

Referring now to FIG. 6, an example of a substrate processing system 650 including a processing chamber 660 having a showerhead 670 is shown. The showerhead 670 includes a stem portion 672 and a head portion 674. The head portion 674 defines an inner cavity 675. Fluids such as precursor or plasma feed gas or purge gas (the latter two may be one and the same) flow through the stem portion 672, onto a dispersion plate 676 and into the inner cavity 675. The fluids then pass through apertures/spaced holes 678 in a bottom surface of the head portion 674 of the showerhead and into the processing chamber.

The stem portion 672 of the showerhead 670 is connected to a top wall of the processing chamber 660 by a showerhead collar 680. The showerhead collar 680 has a generally "T"-shaped cross section and includes a head portion 681 and a stem portion 683. The showerhead collar 680 defines an inner cavity 684 that is cylinder-shaped and that receives the stem portion 672 of the showerhead 670. A plurality of slot-shaped apertures 686 are formed in the stem portion 683 to allow a flow of curtain gas from the inner cavity 684 to an outer surface of the stem portion 683 of the showerhead collar. As is evident from the orientation of the slot-shaped apertures in FIG. 6 as well as the flow lines 320 shown in FIGS. 3A and 3B, the curtain gas may be flowed through the apertures in the showerhead collar and into the processing chamber in a direction substantially parallel to the plane of the substrate and also substantially parallel to the plane of the bottom surface of the head portion of the showerhead.

A fluid connector 690 may be connected to an edge of the head portion 681 of the showerhead collar 680 and is used to supply fluid such as curtain gas. The fluid connector 690 includes one or more conduits and/or connectors that are generally identified at 692. The head portion 681 of the showerhead collar 680 likewise includes conduits and/or connectors that are generally identified at 693 to direct the flow of fluid (such as curtain gas) to the inner cavity 684 of the showerhead collar 680.

A plate 700 is arranged between the head portion 674 of the showerhead 670 and the showerhead collar 680. The plate 700 includes an upper surface 704, a centering opening or bore 710, and a bottom surface 714. In some examples, the plate 700 is made of ceramic. A thickness of the plate 700 may be selected to minimize material and capacitive coupling to ground or parasitic plasma. The upper surface 704 of the plate 700 is spaced from a bottom edge of the showerhead collar 680 to allow fluid to pass there between. The centering bore 710 is also spaced from the stem portion 672 to allow fluid to pass there between. The bottom surface 714 of the plate is spaced from the upper surface of the showerhead 670 to allow fluid to flow there between. In some examples, the plate 700 may be omitted and the processing chamber may be operated without the plate 700.

Flowing curtain gas into the processing chamber through apertures in the stem portions of the showerhead collars associated with the showerheads of the various process stations substantially reduces and/or inhibits unwanted spurious deposition in remote areas of the processing chamber (such as at the backside of the showerheads). Dimensions of the slots and other gaps may be selected to prevent plasma light-up therein and to allow for a Peclet condition to be satisfied to prevent back diffusion for the desired gas flow rates.

Figure 7:
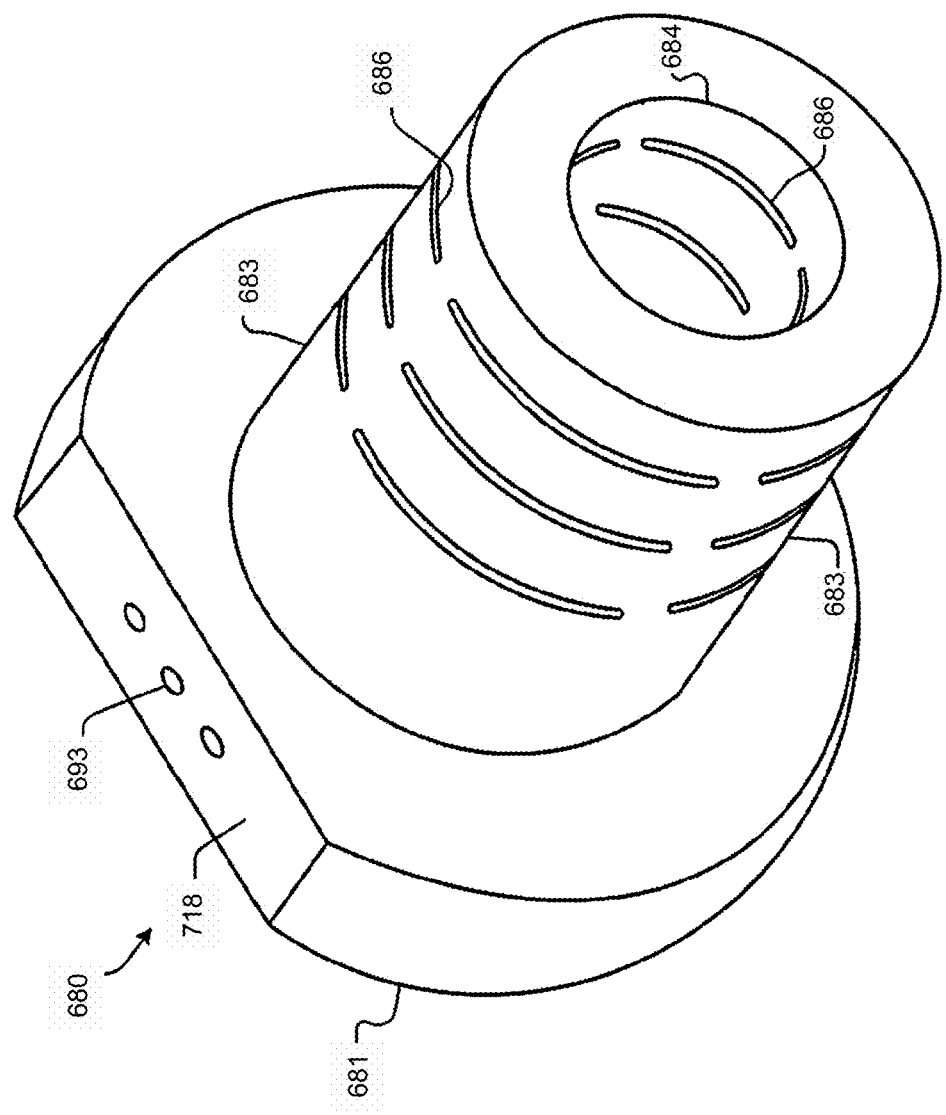
FIG. 7 is a perspective view of an example of a showerhead collar.

Referring now to FIG. 7, an example of the showerhead collar 680 is shown. The showerhead collar 680 includes the head portion 681 and the stem portion 683. The slots 686 may have an arcuate shape and may be arranged around the stem portion 683. The slots 686 allow fluid to flow through them from the inner cavity 684. The head portion 681 may include a mating portion 718 that mates with a corresponding mating portion on the fluid connector 690. When connected, the conduit 693 of the showerhead collar 680 is aligned with the conduit 692 of the fluid connector 690.

Referring now to FIG. 8, an example of the fluid connector 690 for the showerhead collar 680 is shown. While the fluid connector 690 is shown to include a second mating portion 720, a conduit 730, a connector 732, a conduit 734, and a connector 736, other configurations of the fluid connector are contemplated.

Referring now to FIGS. 9A and 9B, examples of the plate 700 are shown. In FIG. 9A, the upper surface 704 of the plate 700 is shown to have a generally circular cross-section and a centering bore 710 arranged at a center of the plate 700. The centering bore 710 includes one or more projections 740 that extend radially inwardly from the centering bore 710. The projections 740 provide uniform spacing between the plate 700 and the stem portion 672. In FIG. 9B, the bottom surface 714 of the plate 700 is shown to include projections 744 that extend downwardly relative to a top of the processing chamber. The projections 744 provide uniform spacing between the bottom surface 714 of the plate 700 and the upper surface of the head portion 674 of the showerhead 670. It is also noted that RF isolation/suppression devices may reduce electric fields in the cavity behind the showerhead, which may also help to further reduce the chance or extent of parasitic plasma generation in the region behind the showerhead. For instance, the projections 740 and 744 may provide spacing that is sufficiently close to reduce parasitic plasma generation—for example if a spacing of approximately 3 mm or less is employed. Such a spacing, for typical process conditions, results in an insufficient space for plasma to form along with plasma sheaths (less than two plasma sheath lengths). Formation of plasma may be affected by plasma density, plasma electron temperature, and voltage across the sheath. Of course, as discussed in detail above, use of a mixture of Ar and $O_2$ as the curtain gas emitted from the showerhead collars is an effective technique for preventing/minimizing parasitic plasma generation (as well as improving deposited film uniformity).

System Controllers

FIG. 2 also depicts an embodiment of a system controller 250 employed to control process conditions and hardware states of process tool 200 and its process stations. System controller 250 may include one or more memory devices 256, one or more mass storage devices 254, and one or more processors 252. Processor 252 may include one or more CPUs, ASICs, general-purpose computer(s) and/or specific purpose computer(s), one or more analog and/or digital input/output connection(s), one or more stepper motor controller board(s), etc.

In some embodiments, system controller 250 controls some or all of the operations of process tool 200 including the operations of its individual process stations. System controller 250 may execute machine-readable system control instructions 258 on processor 252—the system control instructions 258, in some embodiments, loaded into memory device 256 from mass storage device 254. System control instructions 258 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 200. These processes may include various types of processes including, but not limited to, processes related to deposition of film on substrates. System control instructions 258 may be configured in any suitable way. For example, various process tool component subroutines or control objects may be written to control operation of the process tool components necessary to carry out various process tool processes. System control instructions 258 may be coded in any suitable computer readable programming language. In some embodiments, system control instructions 258 are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 258 may include input/output control (IOC) sequencing instructions for controlling the various parameters described above. For example, each phase of a deposition process or processes may include one or more instructions for execution by system controller 250. The instructions for setting process conditions for a film deposition process phase, for example, may be included in a corresponding deposition recipe phase, and likewise for a capping film deposition phase. In some embodiments, the recipe phases may be sequentially arranged, so that all instructions for a process phase are executed concurrently with that process phase.

Other computer-readable instructions and/or programs stored on mass storage device 254 and/or memory device 256 associated with system controller 250 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal 218 and to control the spacing between the substrate and other parts of process tool 200. The positioning program may include instructions for appropriately moving substrates in and out of the reaction chamber as necessary to deposit film on the substrates.

A process gas control program may include instructions for controlling gas composition and flow rates and optionally for flowing gas into the volumes surrounding one or more process stations prior to deposition in order to stabilize the pressure in these volumes. In some embodiments, the process gas control program may include instructions for introducing certain gases into the volume(s) surrounding the one or more process stations within a processing chamber during film deposition on substrates. The process gas control program may also include instructions to deliver these gases at the same rates, for the same durations, or at different rates and/or for different durations depending on the composition of the film being deposited. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on the substrates.

In some embodiments, there may be a user interface associated with system controller 250. The user interface may include a display screen, graphical software displays of the apparatus and/or process conditions, and user input devices such as pointing devices, keyboards, touch screens, microphones, etc.

In some embodiments, parameters adjusted by system controller 250 may relate to process conditions. Non-limiting examples include process gas compositions and flow rates, temperatures, pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, etc. Appropriately programmed feedback and control algorithms may be used with data from these sensors to maintain process conditions.

System controller 250 may provide machine-readable instructions for implementing the above-described deposition processes. The instructions may control a variety of process parameters, such as DC power level, RF bias power level, pressure, temperature, etc. The instructions may control the parameters to operate in-situ deposition of film stacks according to various embodiments described herein.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

Lithographic patterning of a film typically includes some or all of the following operations, each operation enabled with a number of possible tools: (1) application of photoresist on a substrate, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or substrate by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

OTHER EMBODIMENTS

Although the foregoing disclosed techniques, operations, processes, methods, systems, apparatuses, tools, films, chemistries, and compositions have been described in detail within the context of specific embodiments for the purpose of promoting clarity and understanding, it will be apparent to one of ordinary skill in the art that there are many alternative ways of implementing foregoing embodiments which are within the spirit and scope of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

The invention claimed is:

1. A method of performing plasma-activated film deposition in a multi-station semiconductor substrate processing chamber, the method comprising volumetrically isolating a first process station from a second process station by flowing a curtain gas between the first and second process stations;

igniting a first plasma supported by a first plasma feed gas, while flowing the curtain gas, to cause film deposition at the first process station; and igniting a second plasma supported by a second plasma feed gas, while flowing the curtain gas, to cause film deposition at the second process station;

wherein the curtain gas and the first and second plasma feed gases each comprise a high-breakdown voltage species having a breakdown voltage of at least about 250 V for a pressure-distance (pd) value of 3.4 Torr-cm, the curtain gas having a higher concentration of said high-breakdown voltage species than the plasma feed gases.

2. The method of claim 1, wherein the first and second plasma feed gases have substantially the same chemical composition.

3. The method of claim 1, wherein the high-breakdown voltage species makes up about 5-50% of the curtain gas by mole fraction.

4. The method of claim 1, wherein the high-breakdown voltage species is molecular oxygen.

5. The method of claim 4, wherein each of the curtain gas and the first and second plasma feed gases further comprise argon.

6. The method of claim 5, wherein the mole fraction of molecular oxygen is about 5-50% in each of the curtain gas and the first and second plasma feed gases.

7. The method of claim 6, wherein the molar ratio of argon to molecular oxygen is about 1:1 to 19:1 in each of the curtain gas and the first and second plasma feed gases.

8. The method of claim 5, wherein the mole fraction of molecular oxygen is about 5-25% in each of the curtain gas and the first and second plasma feed gases.

9. The method of claim 8, wherein the molar ratio of argon to molecular oxygen is about 3:1 to 19:1 in each of the curtain gas and the first and second plasma feed gases.

10. The method of claim 5, wherein the mole fraction of molecular oxygen is about 5-15% in each of the curtain gas and the first and second plasma feed gases.

11. The method of claim 1, wherein
the first plasma feed gas is flowed to the first process station through apertures in the bottom surface of the head portion of a first chandelier showerhead; and
the second plasma feed gas is flowed to the second process station through apertures in the bottom surface of the head portion of a second chandelier showerhead.

12. The method of claim 11, wherein the curtain gas is released into the process chamber from behind the head portion of each of the first and second chandelier showerheads.

13. The method of claim 12, wherein the curtain gas is flowed into the process chamber, substantially parallel to the plane of the substrate, through apertures in a first showerhead collar which surrounds the stem portion of the first chandelier showerhead, and also through apertures in a second showerhead collar which surrounds the stem portion of the second chandelier showerhead.

14. The method of claim 1, further comprising
adsorbing a first film precursor on a first substrate at the first process station such that the first film precursor forms an adsorption-limited layer, and thereafter removing, when present, unadsorbed first film precursor from the vicinity of the first process station, prior to igniting the first plasma to cause the reaction of the adsorbed first film precursor; and
adsorbing a second film precursor on a second substrate at the second process station such that the second film precursor forms an adsorption-limited layer, and thereafter removing, when present, unadsorbed second film precursor from the vicinity of the second process station, prior to igniting the second plasma to cause the reaction of the adsorbed second film precursor.

15. The method of claim 14, wherein:
the removing of unadsorbed first film precursor comprises purging the vicinity of the first process station with the first plasma feed gas; and
the removing of unadsorbed second film precursor comprises purging the vicinity of the second process station with the second plasma feed gas.

16. The method of claim 15, further comprising:
after the reaction of adsorbed first film precursor, removing first film precursor reaction by-product from the vicinity of the first process station; and
after the reaction of adsorbed second film precursor, removing second film precursor reaction by-product from the vicinity of the second process station.

17. The method of claim 16, wherein:
the removing of first film precursor reaction by-product comprises purging the vicinity of the first process station with the first plasma feed gas; and
the removing of second film precursor reaction by-product comprises purging the vicinity of the second process station with the second plasma feed gas.

18. The method of claim 14, further comprising repeating the adsorbing, removing, and igniting operations at the first and second process stations one or more times to deposit additional layer(s) of film on the substrates at the first and second process stations.

19. The method of claim 1, wherein the plasma feed gas is flowed into the processing chamber at a rate of about 10 to 35 SLM per process station.

20. The method of claim 1, wherein the curtain gas is flowed into the processing chamber at a rate of about 3 to 60 SLM per process station.

* * * * *